US012648332B2

(12) United States Patent
Lee et al.

(10) Patent No.: US 12,648,332 B2
(45) Date of Patent: Jun. 2, 2026

(54) DISPLAY DEVICE AND METHOD OF DRIVING DISPLAY DEVICE

(71) Applicant: SAMSUNG DISPLAY CO., LTD., Yongin-si (KR)

(72) Inventors: Hyun Dae Lee, Yongin-si (KR); Il Nam Kim, Yongin-si (KR); Seung Hyun Moon, Yongin-si (KR); Dong Wook Yang, Yongin-si (KR); Kang Bin Jo, Yongin-si (KR); Go Eun Cha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 632 days.

(21) Appl. No.: 18/167,726

(22) Filed: Feb. 10, 2023

(65) Prior Publication Data

US 2023/0329066 A1 Oct. 12, 2023

(30) Foreign Application Priority Data

Apr. 6, 2022 (KR) ......................... 10-2022-0043050

(51) Int. Cl.
| | |
|---|---|
| *H10K 59/65* | (2023.01) |
| *G06V 40/13* | (2022.01) |
| *G09G 3/3266* | (2016.01) |
| *H10K 59/121* | (2023.01) |
| *H10K 59/131* | (2023.01) |
| *H10K 59/40* | (2023.01) |

(52) U.S. Cl.
CPC ......... *H10K 59/65* (2023.02); *G06V 40/1318* (2022.01); *G09G 3/3266* (2013.01); *H10K 59/1213* (2023.02); *H10K 59/131* (2023.02); *H10K 59/40* (2023.02)

(58) Field of Classification Search
CPC .. H10K 59/65; H10K 59/1213; H10K 59/131; H10K 59/40; H10K 59/13; G06V 40/1318; G09G 3/3266; G09G 3/3233; G09G 3/3225
See application file for complete search history.

(56) References Cited

U.S. PATENT DOCUMENTS

| | | | |
|---|---|---|---|
| 9,280,929 B2 | 3/2016 | In et al. | |
| 9,342,733 B2 | 5/2016 | Lee et al. | |

(Continued)

FOREIGN PATENT DOCUMENTS

| | | |
|---|---|---|
| KR | 10-2017866 | 1/2018 |
| KR | 10-2019-0079859 | 7/2019 |

(Continued)

*Primary Examiner* — S M Sohel Imtiaz
(74) *Attorney, Agent, or Firm* — F. Chau & Associates, LLC

(57) ABSTRACT

A display device includes a light-emitting pixel and a sensor pixel. The light-emitting pixel includes a light-emitting element, a first transistor electrically connected between a first line and a second line and configured to control a driving current flowing through the light-emitting element in response to a voltage of a first node, and a second transistor connected between the first node and a third line. The sensor pixel includes a light-receiving element connected between a sensor node and the second line, and a first sensor transistor configured to control a current flowing between the third line and a readout line in response to a voltage of the sensor node.

13 Claims, 13 Drawing Sheets

(56) References Cited

U.S. PATENT DOCUMENTS

| | | | | |
|---|---|---|---|---|
| 10,203,816 | B2 | 2/2019 | Nelson et al. | |
| 10,437,974 | B2 | 10/2019 | He et al. | |
| 11,087,679 | B2 | 8/2021 | Lim et al. | |
| 2015/0302793 | A1* | 10/2015 | In | G09G 5/18 |
| | | | | 345/82 |
| 2019/0034688 | A1* | 1/2019 | Lee | G06F 3/044 |
| 2020/0098315 | A1* | 3/2020 | Lim | G06F 3/042 |
| 2020/0175249 | A1* | 6/2020 | Kim | G06F 21/32 |
| 2020/0303487 | A1* | 9/2020 | Shin | G09G 3/3266 |
| 2022/0037418 | A1* | 2/2022 | Han | H10K 59/353 |
| 2022/0173174 | A1* | 6/2022 | Hatsumi | G09G 3/3208 |

FOREIGN PATENT DOCUMENTS

| | | |
|---|---|---|
| KR | 10-2020-0034890 | 4/2020 |
| KR | 10-2154501 | 9/2020 |
| WO | 2020-165686 | 8/2020 |

* cited by examiner

FIG. 2

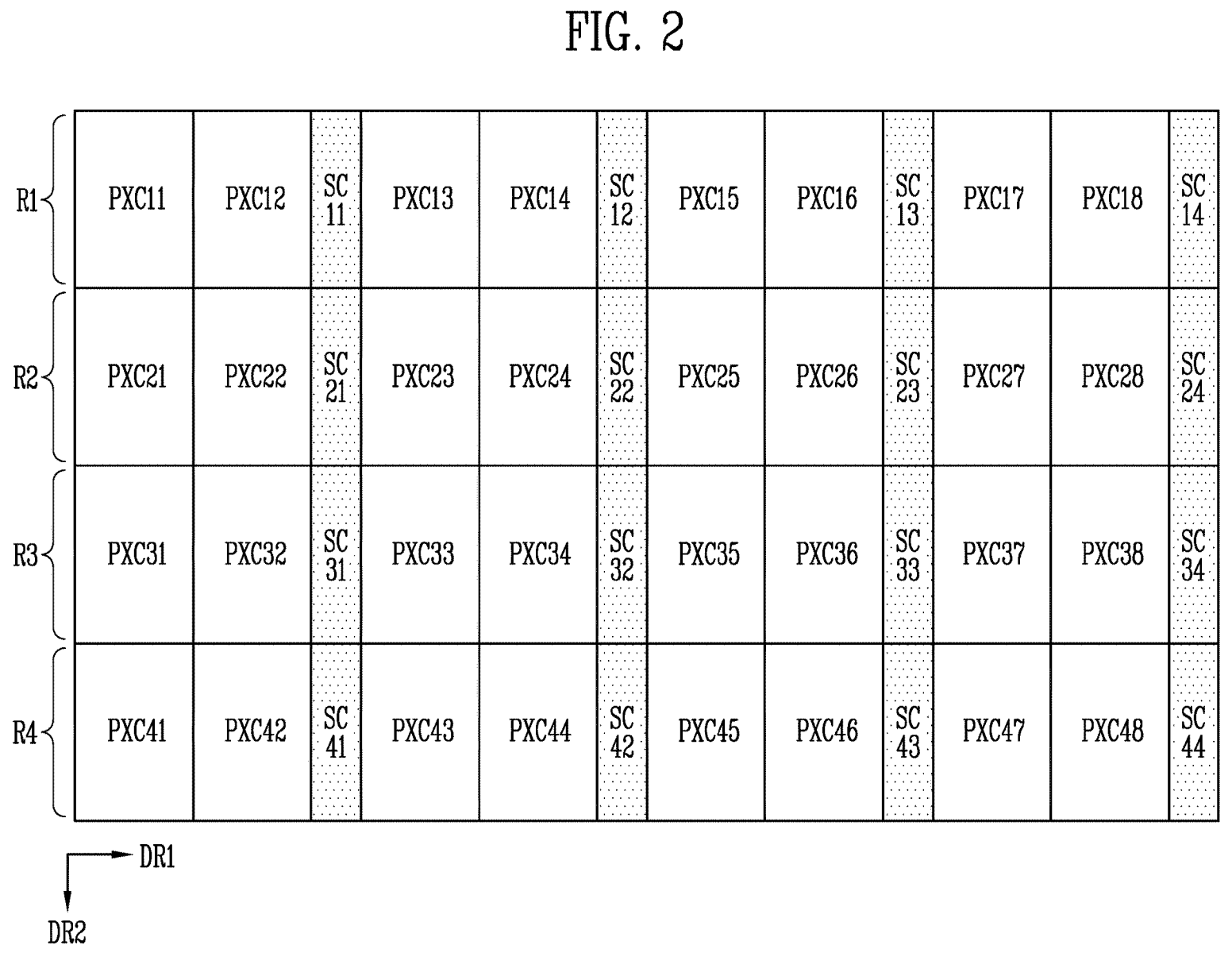

| | | | | | | | | | |
|---|---|---|---|---|---|---|---|---|---|
| PXC11 | PXC12 | SC 11 | PXC13 | PXC14 | SC 12 | PXC15 | PXC16 | SC 13 | PXC17 | PXC18 | SC 14 |
| PXC21 | PXC22 | SC 21 | PXC23 | PXC24 | SC 22 | PXC25 | PXC26 | SC 23 | PXC27 | PXC28 | SC 24 |
| PXC31 | PXC32 | SC 31 | PXC33 | PXC34 | SC 32 | PXC35 | PXC36 | SC 33 | PXC37 | PXC38 | SC 34 |
| PXC41 | PXC42 | SC 41 | PXC43 | PXC44 | SC 42 | PXC45 | PXC46 | SC 43 | PXC47 | PXC48 | SC 44 |

RXk(Dj+1)

PL4

S4i-1

M3

Ei-1

PL1

Ri-1

S3i-1

PL3

S1i-1

M2

M1

CNT2

S2i-1

PL2

M1

CNT1

PL4

CNT3

S4i

M3

Ei

SCi

DISPLAY DEVICE AND METHOD OF DRIVING DISPLAY DEVICE

CROSS-REFERENCE

This application claims priority under 35 U.S.C. § 119 to Korean Patent Application No. 10-2022-0043050 filed in the Korean Intellectual Property Office on Apr. 6, 2022, the entire disclosure of which is herein incorporated by reference.

FIELD

Embodiments of the present disclosure relate to a display device and a method of driving the display device.

DISCUSSION

With the advance of an information-oriented society, various demands for display devices to display images are increasing. For example, a display device may be applied to various electronic devices such as a smartphone, a digital camera, a notebook computer, a navigation system, a smart television, or the like.

Research and development is ongoing for technologies to integrate a biometric sensor for recognizing a fingerprint or the like into a display panel that occupies a maximized area of a display device.

SUMMARY

An embodiment of the present disclosure provides a display device including a light-emitting pixel and a sensor pixel which share a line.

An embodiment of the present disclosure provides a method of driving a display device including a light-emitting pixel and a sensor pixel which share a line.

It should be understood that embodiments of the present disclosure are not limited to those described herein, and other embodiments of the present disclosure will become apparent to those skilled in the art from the following descriptions by way of example.

A display device according to an embodiment of the present disclosure includes a light-emitting pixel and a sensor pixel. The light-emitting pixel includes a light-emitting element connected to a second line, a first transistor electrically connected between a first line and the light-emitting element and configured to control a driving current flowing through the light-emitting element in response to a voltage of a first node, and a second transistor connected between the first node and a third line. The sensor pixel includes a light-receiving element connected between a sensor node and the second line, and a first sensor transistor configured to control a current flowing between the third line and a readout line in response to a voltage of the sensor node.

The light-emitting pixel may further include a third transistor which is electrically connected between a gate electrode of the first transistor and a second electrode of the first transistor and of which a gate electrode is electrically connected to a first gate line, and the sensor pixel may further include a second sensor transistor which is electrically connected between a fourth line and the sensor node and of which a gate electrode is electrically connected to the first gate line.

The sensor pixel may further include a third sensor transistor which is electrically connected between the first sensor transistor and the readout line and of which a gate electrode is electrically connected to a second gate line, one frame period may include a first sub-period and a second sub-period that is later than the first sub-period, a second gate signal having a second turn-on level may be applied to the second gate line in the first sub-period, and a first gate signal having a first turn-on level may be applied to the first gate line in the second sub-period.

During a period between the second sub-period of a first frame period and the first sub-period of a second frame period, electric charges are generated by the light-receiving element, and the sensor pixel may output a signal corresponding to the electric charges in the first sub-period of the second frame period.

When a touch input occurs in the first frame period, a frequency of the first gate signal after the first frame period may be lower than a previous frequency of the first gate signal before the first frame period.

The light-emitting pixel may further include a fourth transistor which is electrically connected between a data line and a first electrode of the first transistor and of which a gate electrode is connected to a third gate line, the light-emitting pixel may be included in an $i^{th}$ pixel row (wherein i is a natural number), and the second gate line may be electrically connected to the gate electrode of the fourth transistor of a previous light-emitting pixel included in a $(i-1)^{th}$ pixel row.

The data line may be electrically connected to the readout line.

When a touch input occurs in the first frame period, after the first frame period, a frequency of the first gate signal may be lower than a previous frequency of the second gate signal.

The display device may further include a driver configured to receive a detection signal from the sensor pixel through the readout line, wherein, while the driver receives the detection signal, a frequency of the first gate signal is lower than a frequency of the second gate signal.

The first transistor may include a silicon semiconductor, and the second transistor may include an oxide semiconductor.

A circuit layer including the first transistor, the second transistor, and the first sensor transistor may be formed on a substrate, and the light-emitting element and the light-receiving element may be disposed on the circuit layer.

The display device may include a first pixel, a second pixel, a third pixel, and a fourth pixel which correspond to the light-emitting pixel and are disposed adjacent to each other in a plan view, wherein the first pixel emits light having a first color; the second and fourth pixels emit light having a second color; the third pixel emits light having a third color, and in a plan view, the sensor pixel is positioned between the second pixel and the third pixel or between the second pixel and the first pixel.

A display device according to an embodiment of the present disclosure includes a light-emitting pixel included in one pixel row, and a sensor pixel. The light-emitting pixel includes a light-emitting element, a first transistor electrically connected between a first line and a second line and configured to control a driving current flowing through the light-emitting element in response to a voltage of a first node, a second transistor which is connected between a data line and a first electrode of the first transistor and of which a gate electrode is electrically connected to a first gate line, and a third transistor which is electrically connected between a gate electrode of the first transistor and a second electrode of the first transistor and of which a gate electrode is electrically connected to a second gate line. The sensor pixel includes a light-receiving element connected between a sensor node and the second line, a first sensor transistor configured to control a current flowing between a third line and a readout line in response to a voltage of the sensor node, a second sensor transistor which is connected between the first sensor transistor and the readout line and of which a gate electrode is connected to a first gate line of a previous pixel row, and a third sensor transistor which is electrically connected between a fourth line and the sensor node and of which a gate electrode is electrically connected to the second gate line.

One frame period may include a first sub-period and a second sub-period that is later than the first sub-period, a first gate signal having a first turn-on level may be applied to the second gate line in the first sub-period, and a second gate signal having a second turn-on level may be applied to the second gate line in the second sub-period.

During a period between the second sub-period of a first frame period and the first sub-period of a second frame period, electric charges are generated by the light-receiving element, and the sensor pixel may output a signal corresponding to the electric charges in the first sub-period of the second frame period.

A frequency of the first gate signal in the second frame period may be lower than a previous frequency of the first gate signal in the first frame period.

The data line may be electrically connected to the readout line.

When a touch input occurs in a first frame period, after the first frame period, a frequency of the second gate signal applied to the second gate line may be lower than a frequency of the first gate signal applied to the first gate line.

The display device may further include a driver configured to receive a detection signal from the sensor pixel through the readout line, wherein, while the driver receives the detection signal, the frequency of the first gate signal is lower than the frequency of the second gate signal.

A method of driving a display device according to an embodiment of the present disclosure is performed in a display device including light-emitting pixels and sensor pixels which share lines. The method includes scanning the light-emitting pixels and the sensor pixels at a first driving frequency to display an emission pattern through at least some of the light-emitting pixels, and scanning the light-emitting pixels and the sensor pixels at a second driving frequency to receive detection signals from the sensor pixels.

Other features of these and other embodiments may be understood by considering the detailed description below in conjunction with the accompanying drawings.

BRIEF DESCRIPTION OF THE DRAWINGS

FIG. 2 is a layout diagram illustrating an example of an arrangement of backplane circuits in a display area of a display panel included in the display device of FIG. 1.

FIG. 4 is a circuit diagram illustrating an example of a pixel and an optical sensor included in the display area of FIG. 3.

FIGS. 9A, 9B, and 9C are hybrid diagrams for describing an embodiment of the display device of FIG. 1.

FIG. 10 is a waveform diagram for describing an embodiment of the operation of the pixel and the optical sensor of FIG. 4.

FIG. 11 is a hybrid diagram for describing a method of driving a display device according to an embodiment of the present disclosure.

DETAILED DESCRIPTION

Figure 1:
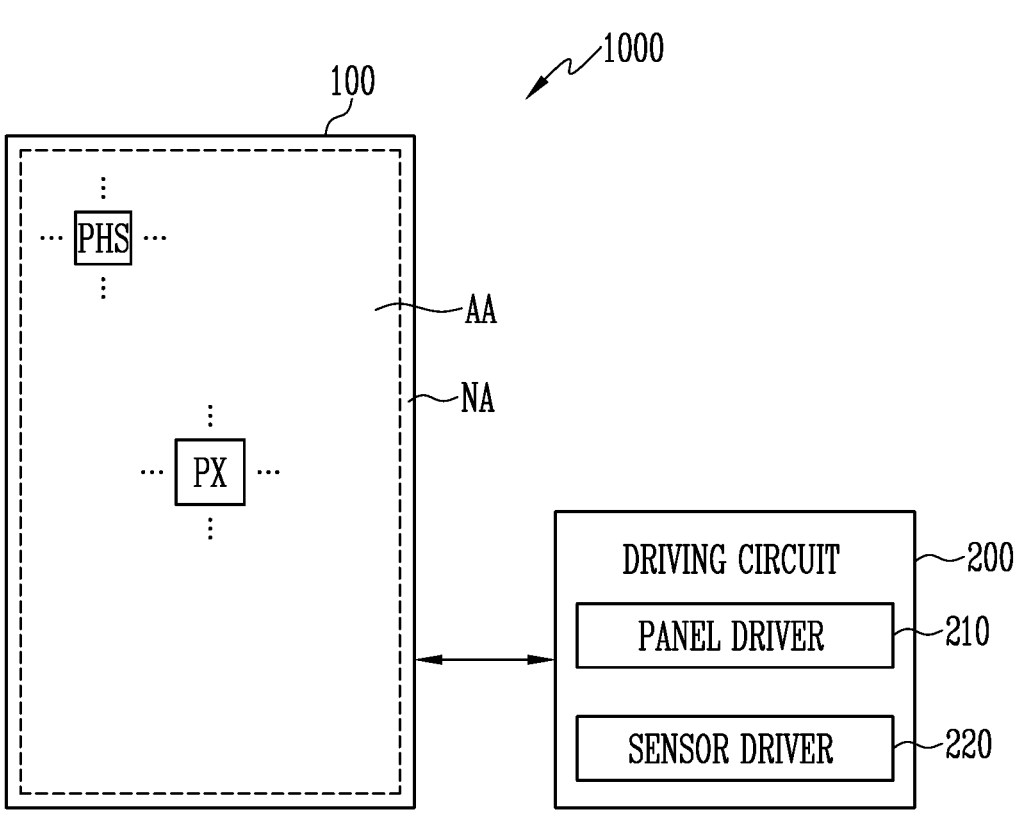
FIG. 1 is a block diagram illustrating a display device according to embodiments.

While the present disclosure is open to various modifications and alternative embodiments, specific embodiments thereof will be described and illustrated by way of example with respect to the accompanying drawings. The singular forms "a," "an," and "the" as used herein are intended to include the plural forms as well unless the context clearly indicates otherwise Some embodiments may be described in the accompanying drawings in relation to functional blocks, units, and/or modules. Those skilled in the art will understand that such blocks, units, and/or modules are physically implemented using logic circuits, discrete components, microprocessors, hard-wired circuits, memory elements, line connections, and other electronic circuits. The blocks, units, and/or modules may be formed using semiconductor-based manufacturing techniques or other manufacturing techniques. Blocks, units, and/or modules implemented using a microprocessor or other similar hardware may be programmed and controlled using software to perform various functions discussed herein and may optionally be driven by firmware and/or software. In addition, each block, unit, and/or module may be implemented using dedicated hardware or a combination of dedicated hardware and processors (e.g., one or more programmed microprocessors and related circuits) that perform different functions. Further, in some embodiments, blocks, units, and/or modules may be physically separated into two or more individual blocks, units, and/or modules which interact without departing from the scope of the present disclosure. In addition, in some embodiments, blocks, units, and/or modules may be physically combined into more complex blocks, units and/or modules without departing from the scope of the present disclosure.

The present disclosure is not limited to the embodiments disclosed below, and may be changed and implemented in various forms. In addition, each of the embodiments disclosed below may be implemented alone or in combination with at least one other embodiment.

In the drawings, some components that are not directly related to the features being described of the present disclosure may be omitted to clearly illustrate other components or features of the present disclosure. Furthermore, the sizes, ratios, or the like of some elements in the drawings may be slightly exaggerated. It should be noted that the same reference numerals may be used to designate the same or similar elements throughout the drawings, and repetitive explanation may be omitted.

FIG. 1 illustrates a display device according to an embodiment.

Referring to FIG. 1, a display device 1000 may include a display panel 100 and a driving circuit 200. In an embodiment, the driving circuit 200 may include a panel driver 210 and a sensor driver 220. The driving circuit 200 may be implemented as one integrated circuit, but the present disclosure is not limited thereto. For example, each of the panel driver 210 and the sensor driver 220 may be implemented as independent integrated circuits.

The display device 1000 may be implemented as a self-luminous display device including a plurality of self-luminous elements. In particular, the display device 1000 may be an organic light-emitting display device including organic light-emitting elements. However, this is merely an example, and the display device 1000 may be implemented as a display device including inorganic light-emitting elements, a display device including light-emitting elements made of an inorganic material and an organic material in combination, a display device displaying an image using quantum dots, or the like.

The display device 1000 may be a flat display device, a flexible display device, a curved display device, a foldable display device, a bendable display device, or a rollable display device. In addition, the display device may be applied to a transparent display device, a head-mounted display device, a wearable display device, and the like.

The display panel 100 includes a display area AA and a non-display area NA. The display area AA may be an area in which pixels PX are provided. The pixel PX may be referred to as a subpixel or a light-emitting pixel. The pixel PX may include one or more light-emitting elements. For example, the light-emitting element may include a light-emitting layer (e.g., an organic light-emitting layer). A section in which the light-emitting element emits light may be defined as a light-emitting area. The display device 1000 may display an image in the display area AA by driving the pixel PX in response to image data.

The non-display area NA may be an area provided around the display area AA. In an embodiment, the non-display area NA may comprehensively mean an area other than the display area AA in the display panel 100. For example, the non-display area NA may include a line area, a pad area, and various dummy areas.

In an embodiment, an optical sensor PHS may be included in the display area AA. The optical sensor PHS may be referred to as a sensor pixel. The optical sensor PHS may include a light-receiving element including a light-receiving layer. In the display area AA, the light-receiving layer of the light-receiving element may be disposed apart from the light-emitting layer of the light-emitting element.

In an embodiment, a plurality of optical sensors PHS may be distributed apart from each other over an entire area of the display area AA. However, this is merely an example, and a portion of the display area AA may be set as a certain sensing area, and the optical sensors PHS may be provided in the corresponding sensing area. In addition, the optical sensor PHS may be included in at least a portion of the non-display area NA.

In an embodiment, the optical sensor PHS may detect light emitted from a light source (e.g., the light-emitting element of the pixel PX) that is reflected by an external object (e.g., a user's finger or the like). For example, a user's fingerprint may be detected through the optical sensor PHS. Hereinafter, the present disclosure will be described by exemplifying that the optical sensor PHS is used for detecting a fingerprint, but in various embodiments, the optical sensor PHS may detect a variety of biometric information such as an iris and a vein.

The display device 1000 may include the panel driver 210 and the sensor driver 220. Although the panel driver 210 and the sensor driver 220 are illustrated separately in FIG. 1, the technical spirit of the present disclosure is not limited thereto. For example, at least a portion of the sensor driver 220 may be included in the panel driver 210 or may operate in conjunction with the panel driver unit 210.

The panel driver 210 may scan the pixel PX of the display area AA and supply a data signal corresponding to image data (or an image) to the pixel PX. The display panel 100 may display an image corresponding to the data signal.

In an embodiment, the panel driver 210 may supply a driving signal for light sensing (e.g., fingerprint sensing) to the pixel PX. Such a driving signal may be provided such that the pixel PX emits light to operate as a light source for the optical sensor PHS. In an embodiment, the panel driver 210 may also supply the driving signal and/or other driving signals for light sensing to the optical sensor PHS. However, this is merely an example, and driving signals for light sensing may also be provided by the sensor driver 220.

The sensor driver 220 may detect biometric information such as a user's fingerprint based on a detection signal received from the optical sensor PHS. In an embodiment, the sensor driver 220 may supply the driving signals to the optical sensor PHS and/or the pixel PX.

Figure 3:
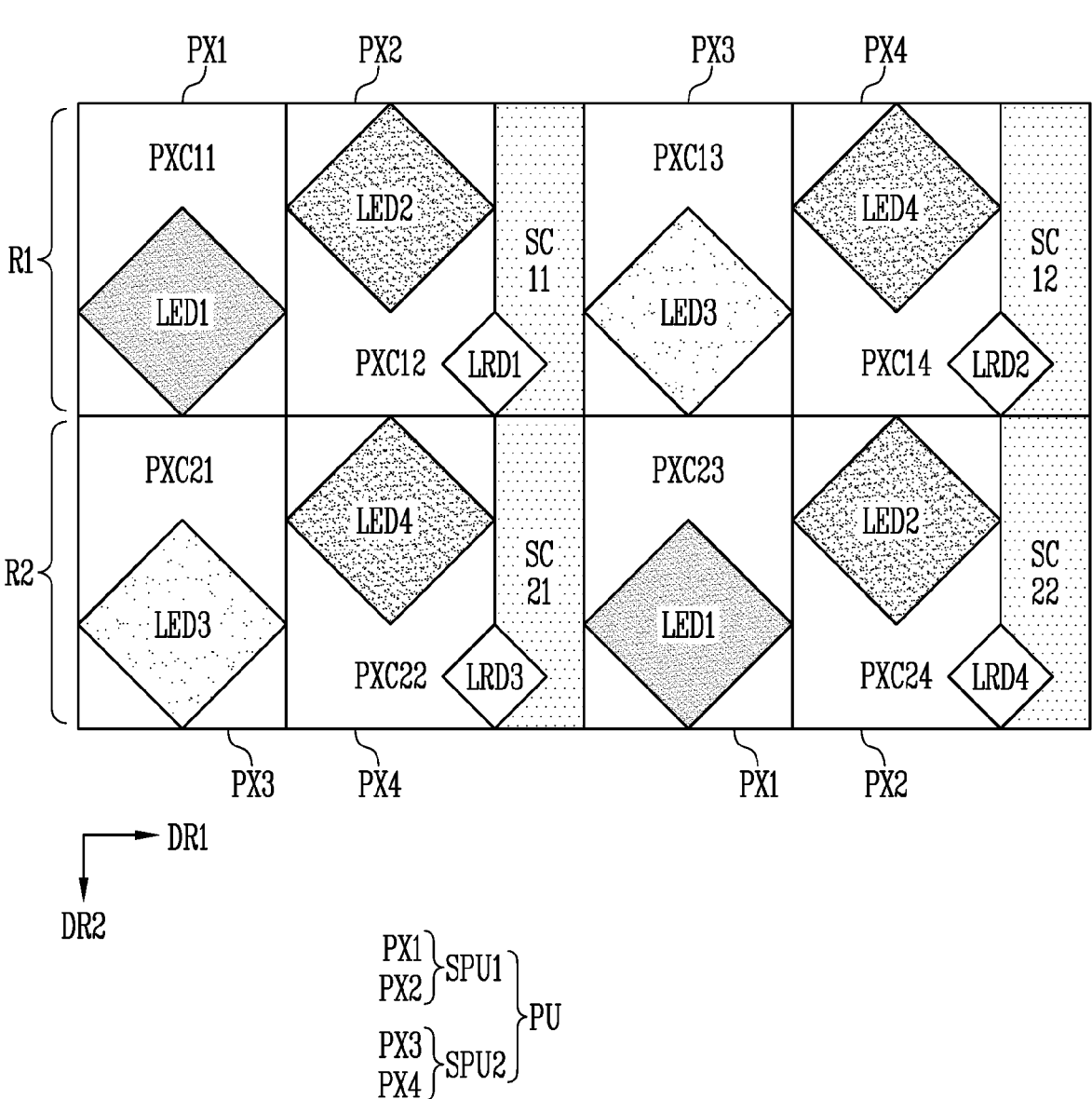
FIG. 3 is a layout diagram illustrating an example of the display area of the display panel included in the display device of FIG. 1.

FIG. 2 illustrates an example of an arrangement of back-plane circuits in a display area of the display panel included in a display device of FIG. 1. FIG. 3 illustrates an example of the display area of the display panel included in the display device of FIG. 1.

Referring to FIGS. 1, 2, and 3, a plurality of pixels PX1, PX2, PX3, and PX4 and a plurality of optical sensors PHS may be disposed in a display area AA of a display panel 100.

A display area AA may be divided into a plurality of pixel rows R1 to R4. Each of the pixel rows R1 to R4 may extend in a first direction DR1 and may be arranged in a second direction DR2. Each of the pixel rows R1 to R4 may include the pixels PX1, PX2, PX3, and PX4. Each of the pixels PX1, PX2, PX3, and PX4 may include one of pixel circuits PXC11 to PXC48 and one of light-emitting elements LED1 to LED4.

In an embodiment, a first pixel PX1, a second pixel PX2, and a third pixel PX3 may emit first color light, second color light, and third color light, respectively. The first color light, the second color light, and the third color light may be pieces of light having different colors and may each have one of red, green, and blue. In an embodiment, a fourth pixel PX4 may emit the same color light as the second pixel PX2. For example, a first light-emitting element LED1 may emit the first color light, a second light-emitting element LED2 and a fourth light-emitting element LED4 may emit the second color light, and a third light-emitting element LED3 may emit the third color light.

In FIG. 3, each of the first to fourth light-emitting elements LED1 to LED4 may be understood as a light-emitting area corresponding to a light-emitting layer. However, this is merely for convenience of description, and a color of light emitted by the first to fourth light-emitting elements LED1 to LED4, and the positions, areas, and shapes of the first to fourth light-emitting elements LED1 to LED4 are not limited thereto.

In an embodiment, the pixels PX1, PX2, PX3, and PX4 may be arranged in the first direction DR1 in the order of the first pixel PX1 emitting red light, the second pixel PX2 emitting green light, the third pixel PX3 emitting blue light, and the fourth pixel PX4 emitting green light in each of odd-numbered pixel rows including a first pixel row R1 (or a first horizontal line) and a third pixel row R3 (a third horizontal line).

The pixels PX1, PX2, PX3, and PX4 may be arranged in the first direction DR1 in the order of the third pixel PX3, the fourth pixel PX4, the first pixel PX1, and the second pixel PX2 in each of even-numbered pixel rows including a second pixel row R2 (a second horizontal line) and a fourth pixel row R4 (or a fourth horizontal line).

In an embodiment, the first pixel PX1 and the second pixel PX2 may constitute a first subpixel unit SPU1, and the third pixel PX3 and the fourth pixel PX4 may constitute a second subpixel unit. Accordingly, the first subpixel unit SPU1 and the second subpixel unit SPU2 may be alternately disposed in the odd-numbered pixel rows R1 and R3, and the second subpixel units SPU2 and the first subpixel units SPU1 may be alternately disposed in the even-numbered pixel rows R2 and R4 in a pattern opposite to that of the odd-numbered pixel rows R1 and R3.

Certain first and second subpixel units SPU1 and SPU2 adjacent to each other may include the first to fourth pixels PX1 to PX4, and for convenience of description, it may be understood that the first and second subpixel units SPU1 and SPU2 constitute one pixel unit PU. For example, FIG. 3 illustrates the pixel unit PU of each of the first pixel row R1 and the second pixel row R2.

However, this is merely an example, and the arrangement of the pixels is not limited thereto.

In the first pixel row R1, pixel circuits PXC11 to PXC18 respectively corresponding to the pixels PX1, PX2, PX3, and PX4 of the first pixel row R1 may be arranged in the first direction DR1. In the second pixel row R2, pixel circuits PXC21 to PXC28 respectively corresponding to the pixels PX1, PX2, PX3, and PX4 of the second pixel row R2 may be arranged in the first direction DR1. Similarly, in the third and fourth pixel rows R3 and R4, pixel circuits PXC31 to PXC38 and PXC41 to PXC48 respectively corresponding to the pixels PX1, PX2, PX3, and PX4 of the third and fourth pixel rows R3 and R4 may be arranged in the first direction DR1.

In FIG. 2, first to fourth pixel circuits PXC11 to PXC14 of the first pixel row R1 may be included in one pixel unit PU, and fifth to eighth pixel circuits PXC15 to PXC18 of the first pixel row R1 may be included in another pixel unit PU.

Similarly, first to fourth pixel circuits PXC21 to PXC2 of the second pixel row R2, fifth to eighth pixel circuits PXC25 to PXC28 of the second pixel row R2, first to fourth pixel circuits PXC31 to PXC34 of the third pixel row R3, fifth to eighth pixel circuits PXC35 to PXC38 of the third pixel row R3, first to fourth pixel circuits PXC41 to PXC44 of the fourth pixel row R4, and fifth to eighth pixel circuits PXC45 to PXC48 of the fourth pixel row R4 may also be included in different pixel units PU.

In an embodiment, the pixel rows R1 to R4 may include light-receiving elements LRD1 to LRD4. In FIG. 3, each of the first to fourth light-receiving elements LRD1 to LRD4 may be understood as a light-emitting area corresponding to a light-receiving layer. However, this is merely for convenience of description, and the positions, areas, and shapes of the first to fourth light-receiving elements LRD1 to LRD4 are not limited thereto.

The light-receiving elements LRD1 and LRD2 of the first pixel row R1 may overlap at least portions of the pixel circuits PXC11 to PXC14 of the first pixel row R1 and sensor circuits SC11 and SC12 of the first pixel row R1. The light-receiving elements LRD3 and LRD4 of the second pixel row R2 may overlap at least portions of the pixel circuits PXC21 to PXC24 of the second pixel row R2 and sensor circuits SC21 and SC22 of the second pixel row R2.

In an embodiment, the first light-receiving element LRD1 may overlap at least a portion of a first sensor circuit SC11 of the first pixel row R1, and the third light-receiving element LRD3 may overlap at least a portion of a first sensor circuit SC21 of the second pixel row R2.

In addition, referring to FIGS. 2 and 3 together, the second light-receiving element LRD2 may overlaps at least a portion of a second sensor circuit SC12 of the first pixel row R1, and the fourth light-receiving element LRD4 may overlap at least a portion of a second sensor circuit SC22 of the second pixel row R2.

The first to fourth light-receiving elements LRD1 to LRD4 may be formed in the display area AA in the arrangement shown in FIG. 3.

In an embodiment, sensor circuits SC11 to SC44 may be connected to corresponding light-receiving elements. For example, the first sensor circuit SC11 of the first pixel row R1 may be connected to the first light-receiving element LRD1, and the first sensor circuit SC11 and the first light-receiving element LRD1 may constitute one optical sensor PHS. Similarly, the second sensor circuit SC12 of the first pixel row R1 may be connected to the second light-receiving element LRD2, the first sensor circuit SC21 of the second pixel row R2 may be connected to the third light-receiving element LRD3, and the second sensor circuit SC22 of the second pixel row R2 may be connected to the fourth light-receiving element LRD4. However, the present disclosure is not limited thereto.

For example, some of the sensor circuits SC11 to SC44 may be provided, and some of the sensor circuits may be connected to a plurality of light-receiving elements. Referring to FIG. 3, for example, the first sensor circuit SC21 of the second pixel row R2 may be provided, the remaining sensor circuits (e.g., SC11, SC12, and SC22) may be omitted, and the first sensor circuit SC21 of the second pixel row R2 may be commonly connected to the first to fourth light-receiving elements LRD1 to LRD4. That is, the first sensor circuit SC21 of the second pixel row R2 and the first to fourth light-receiving elements LRD1 to LRD4 may constitute one optical sensor PHS. In this case, a detection current (or a detection voltage) generated by the first to fourth light-receiving elements LRD1 to LRD4 may be detected by one sensor circuit (e.g., the first sensor circuit SC21 of the second pixel row R2). In this case, a decrease in resolution of the display area AA can be minimized by reducing the number of the sensor circuits. In addition, a current generated by the first to fourth light-receiving elements LRD1 to LRD4 is provided to one sensor circuit (e.g., SC11), thereby increasing an amount of light received by the optical sensor and improving light sensing performance.

The first sensor circuit SC11 of the first pixel row R1 may be disposed between the first subpixel unit SPU1 and the second sub-pixel unit SPU2 included in the pixel unit PU. For example, the first and second pixel circuits PXC11 and PXC12 of the first pixel row R1 may be included in the first subpixel unit SPU1, and the third and fourth pixel circuits PXC13 and PXC14 of the first pixel row R1 may be included in the second sub-pixel unit SPU2. Accordingly, at least two pixel circuits (e.g., PXC13 and PXC14) may be disposed between the first sensor circuit SC11 and the second sensor circuit SC12 adjacent to each other in the first pixel row R1.

The second sensor circuit SC12 of the first pixel row R1, the first sensor circuit SC21 of the second pixel row R2, and the second sensor circuit SC22 of the second pixel row R2 may be disposed between the first subpixel unit SPU1 and the second subpixel unit SPU2 similarly to the first sensor circuit SC11 of the first pixel row R1

Figure 4:
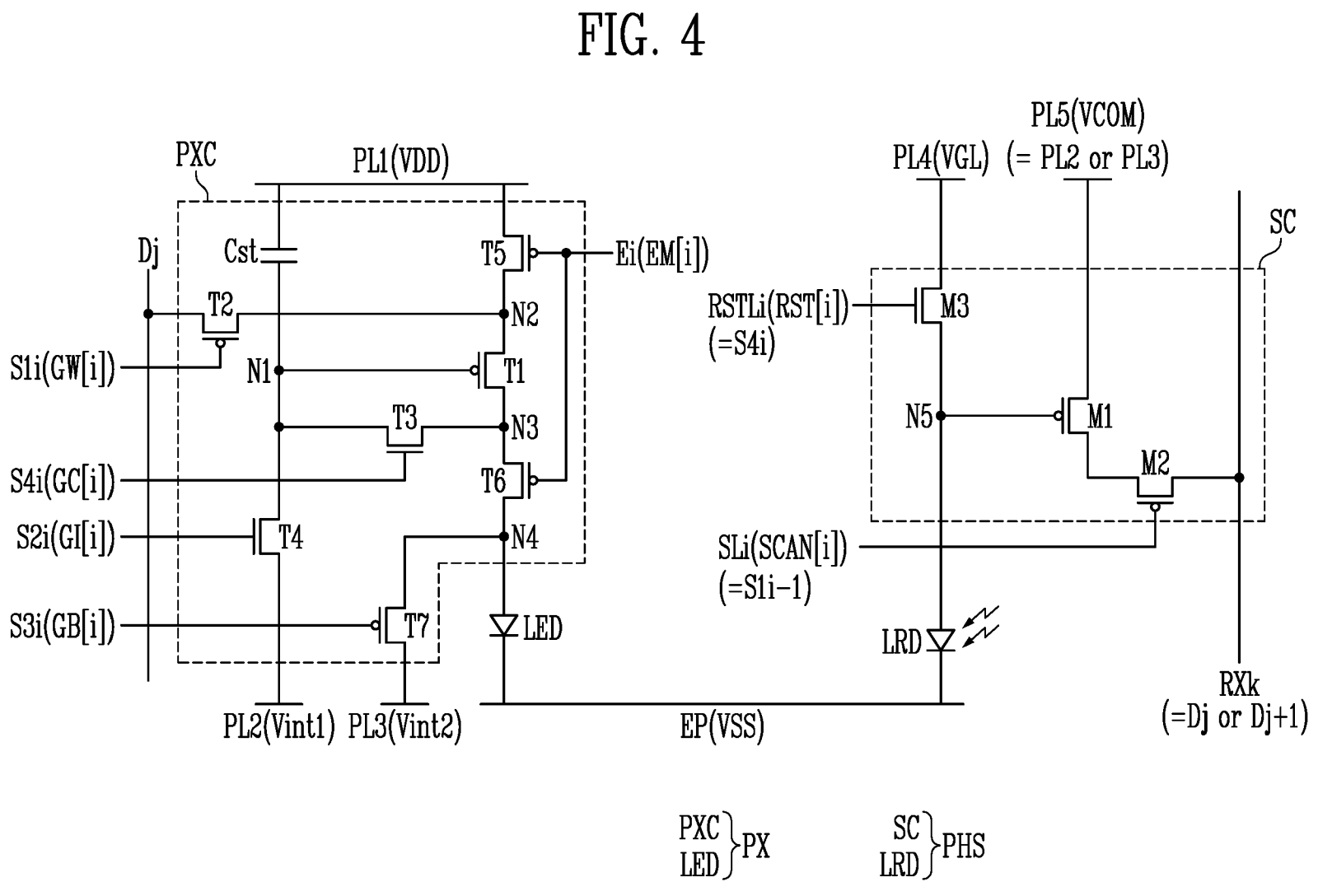

FIG. 4 illustrates an example of a pixel and an optical sensor included in the display area of FIG. 3. For convenience of description, FIG. 4 illustrates a pixel PX positioned in an $i^{th}$ horizontal line (or an $i^{th}$ pixel row) and connected to a $j^{th}$ data line Dj (wherein i is a natural number).

Referring to 2, 3, and 4, the pixel PX and a sensor circuit SC may be disposed in the $i^{th}$ horizontal line.

The pixel PX may include a light-emitting element LED and a pixel circuit PXC. In an embodiment, the pixel circuit PXC may include first to seventh pixel transistors T1 to T7 and a storage capacitor Cst.

The first pixel transistor T1 (or a driving transistor) may be connected between a first power line PL1 and a first electrode of the light-emitting element LED. The first pixel transistor T1 may include a gate electrode connected to a first node N1. The first pixel transistor T1 may control an amount of a current (driving current) flowing from the first power line PL1 to an electrode EP (or a power line) through the light-emitting element LED based on a voltage of the first node N1. A first power voltage VDD may be provided to the first power line PL1, a second power voltage VSS may be provided to the electrode EP, and the first power voltage VDD may be set to be higher than the second power voltage VSS. For example, the first power voltage VDD may be about 4.6 V, and the second power voltage VSS may be about −2.6 V.

The second pixel transistor T2 may be connected between the $j^{th}$ data line Dj and a second node N2. A gate electrode of the second pixel transistor T2 may be connected to an $i^{th}$-first gate line S1$i$. When a first gate signal GW[i] is supplied to the $i^{th}$-first gate line S1$i$, the second pixel transistor T2 may be turned on to electrically connect the $j^{th}$ data line Dj and the second node N2.

The third pixel transistor T3 may be connected between the first node N1 and a third node N3. A gate electrode of the third pixel transistor T3 may be connected to an $i^{th}$-fourth gate line S4$i$. When a fourth gate signal GC[i] is supplied to the $i^{th}$-fourth gate line S4$i$, the third pixel transistor T3 may be turned on. When the third pixel transistor T3 is turned on, the first pixel transistor T1 may have a diode-connected form.

The fourth pixel transistor T4 may be connected between the first node N1 and a second power line PL2. A gate electrode of the fourth pixel transistor T4 may be connected to an $i^{th}$-second gate line S2$i$. A first initialization power voltage Vint1 may be provided to the second power line PL2. For example, the first initialization power voltage Vint1 may be about −3.8 V. The fourth pixel transistor T4 may be turned on by a second gate signal GI[i] supplied to the $i^{th}$-second gate line S2$i$. When the fourth pixel transistor T4 is turned on, the first initialization power voltage Vint1 may be supplied to the first node N1 (e.g., the gate electrode of the first pixel transistor T1).

The fifth pixel transistor T5 may be connected between the first power line PL1 and the second node N2. A gate electrode of the fifth pixel transistor T5 may be connected to the $i^{th}$ emission control line Ei. The sixth pixel transistor T6 may be connected between the third node N3 and the light-emitting element LED (or a fourth node N4). A gate electrode of the sixth pixel transistor T6 may be connected to the $i^{th}$ emission control line Ei. The fifth pixel transistor T5 and the sixth pixel transistor T6 may be turned off when an emission control signal EM[i] is supplied to the $i^{th}$ emission control line Ei and may be turned on in other cases.

The seventh pixel transistor T7 may be connected between the first electrode of the light-emitting element LED (e.g., the fourth node N4) and a third power line PL3. A gate electrode of the seventh pixel transistor T7 may be connected to an $i^{th}$-third gate line S3$i$. A second initialization power voltage Vint2 may be provided to the third power line PL3. For example, the second initialization power voltage Vint2 may be about −3.8 V. According to embodiments, the second initialization power voltage Vint2 may be different from the first initialization power voltage Vint1. The seventh pixel transistor T7 may be turned on by a third gate signal GB[i] supplied to the $i^{th}$-third gate line S3$i$ to provide the second initialization power voltage Vint2 to the first electrode of the light-emitting element LED.

The storage capacitor Cst may be connected between the first power line PL1 and the first node N1.

The sensor circuit SC may include first to third sensor transistors M1 to M3.

The first and second sensor transistors M1 and M2 may be connected in series between a fifth power line PL5 and a $K^{th}$ readout line RX (wherein k is a natural number).

The first sensor transistor M1 may be connected between the fifth power line PL5 and the second sensor transistor M2. A gate electrode of the first sensor transistor M1 may be connected to a fifth node N5 (or a sensor node). A common voltage VCOM may be provided to the fifth power line PL5. For example, the common voltage VCOM may be about −3.8 V.

In an embodiment, the fifth power line PL5 may be electrically connected to or integrally formed with the second power line PL2 or the third power line PL3, and the common voltage VCOM applied to the fifth power line PL5 may be the same as the first initialization power supply voltage Vint1 or the second initialization power supply voltage Vint2.

The second sensor transistor M2 may be connected between the first sensor transistor M1 and the $K^{th}$ readout line RXk. A gate electrode of the second sensor transistor M2 may be connected to an $i^{th}$ scan line SLi.

In an embodiment, the gate electrode of the second sensor transistor M2 and the gate electrode of the second pixel transistor T2 may share a first gate line S1$i$−1 of an $(i−1)^{th}$ horizontal line (e.g., a horizontal line before the $i^{th}$ horizontal line or an $(i−1)^{th}$ pixel row). In other words, the $i^{th}$ scan line SLi may be electrically connected to or formed integrally with an $(i−1)^{th}$-first gate line S1$i$−1, and a scan signal SCAN[i] applied to the $i^{th}$ scan line SLi may be the same as a first gate signal (e.g., "GW[i−1]") applied to the $(i−1)^{th}$-first gate line S1$i$−1.

In an embodiment, the $k^{th}$ read line RXk may be a data line. For example, the $k^{th}$ readout line RXk may be the $j^{th}$ data line Dj or a $(j+1)^{th}$ data line Dj+1.

The third sensor transistor M3 may be connected between a fourth power line PL4 and the fifth node N5. A gate electrode of the third sensor transistor M3 may be connected to an $i^{th}$ reset line RSTLi. A reset voltage VGL is provided to the fourth power line PL4, and the reset voltage VGL may be about −7 V.

In an embodiment, the gate electrode of the third sensor transistor M3 and the gate electrode of the third pixel transistor T3 may share the $i^{th}$-fourth gate line S4$i$. In other words, the $i^{th}$ reset line RSTLi may be electrically connected to or formed integrally with the $i^{th}$ fourth gate line S4$i$, and a reset signal RST[i] applied to the $i^{th}$ reset line RSTLi may be the same as the fourth gate signal GC[i] applied to the $i^{th}$ fourth gate line S4$i$.

At least one light-receiving element LRD may be connected between the fifth node N5 and the electrode EP to which the second power voltage VSS is provided.

The light-receiving element LRD may generate electric charges (or a current) based on incident light. That is, the light-receiving element LRD may perform a photoelectric conversion function. For example, the light-receiving element LRD may be implemented as a photodiode.

When the third sensor transistor M3 is turned on by the reset signal RST[i] supplied to the $i^{th}$ reset line RSTLi, the reset voltage VGL may be provided to the fifth node N5. For example, a voltage of the fifth node N5 may be reset by the reset voltage VGL. After the reset voltage VGL is applied to the fifth node N5, the light-receiving element LRD may perform the photoelectric conversion function.

The voltage of the fifth node N5 may be changed by the operation of the light-receiving element LRD. The voltage of the fifth node N5 (or the electric charges or current generated in the light-receiving element LRD) may be changed according to an intensity of light incident on the light-receiving element LRD and a time for which light is incident (or a time for which the light-receiving element LRD is exposed to light).

When the second sensor transistor M2 is turned on by the scan signal SCAN[i] provided to the $i^{th}$ scan line Sli, a detection value (current and/or voltage) generated based on the voltage of the fifth node N5 may flow to the readout line RXk.

In an embodiment, each of the pixel circuit PXC and the sensor circuit SC may include a P-type transistor and an N-type transistor. In an embodiment, the third pixel transistor T3, the fourth pixel transistor T4, and the third sensor transistor M3 may be formed as oxide semiconductor transistors. For example, the third pixel transistor T3, the fourth pixel transistor T4, and the third sensor transistor M3 may be N-type oxide semiconductor transistors and may include an oxide semiconductor layer as an active layer.

An oxide semiconductor transistor may enable a low-temperature process and may have charge mobility lower than that of a polysilicon semiconductor transistor. That is, the oxide semiconductor transistor has excellent off-current characteristics Accordingly, a leakage current in the third pixel transistor T3, the fourth pixel transistor T4, and the third sensor transistor M3 can be minimized.

The remaining transistors may be formed as polysilicon transistors and may include a polysilicon semiconductor layer as an active layer. For example, the active layer may be formed, for example, through a low-temperature polysilicon process (LTPS process). For example, the polysilicon transistor may be a P-type polysilicon transistor. Since the polysilicon semiconductor transistor may have a relatively fast response speed, the polysilicon semiconductor transistor can be applied to a switching element for fast switching.

As described above, a power line (e.g., the second power line PL2 or the third power line PL3) of the pixel circuit PXC may be shaped with a power line (e.g., the fifth power line PL5) of the sensor circuit SC, a gate line (e.g., the $(i-1)^{th}$-first gate line S1$i$–1 and/or the $i^{th}$-fourth gate line S4$i$) of the pixel circuit PXC may be shared with a scan line (e.g., the $i^{th}$ scan line SLi and/or the $i^{th}$ reset line RSTLi) of the sensor circuit SC, or a data line (e.g., the $j^{th}$ data line Dj or the $(j+1)^{th}$ data line Dj+1) of the pixel circuit PXC may be shared with a readout line (e.g., the $K^{th}$ readout line RXk) of the sensor circuit SC That is, the pixel circuit PXC and the sensor circuit SC may share at least one of the power line, the gate line (the a scan line), and the data line (or the readout line). In this case, the number of lines disposed on a display panel 100 (see FIG. 1) can be relatively reduced, and a decrease in resolution due to line (e.g., relatively many lines) can be minimized.

In addition, since the pixel PX and the light sensor PHS are simultaneously controlled, a driver for driving the pixel PX and a driver for driving the optical sensor PHS can be integrated, and a component for synchronizing the drivers can be omitted.

Figure 5:
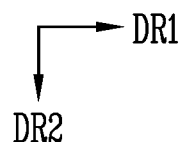
FIG. 5 is a layout diagram illustrating an example of lines and transistors disposed in a sensor circuit area in the display area of FIG. 3.

FIG. 5 illustrates an example of lines and transistors disposed in a sensor circuit area in the display area of FIG. 3. FIG. 5 exemplarily illustrates an $(i-1)^{th}$ pixel row Ri–1 and an $i^{th}$ pixel row Ri.

Referring to FIGS. 2, 3, 4, and 5, in the $(i-1)^{th}$ pixel row Ri–1, an $(i-1)^{th}$-first gate line S1$i$–1, an $(i-1)^{th}$-second gate line S2$i$–1, an $(i-1)^{th}$-third gate line S3$i$–1, an $(i-1)^{th}$-fourth gate line S4$i$–1, and an $(i-1)^{th}$ emission control line Ei–1 may extend in a direction DR1. In the $i^{th}$ pixel row Ri, an $i^{th}$-first gate line S1$i$, an $i^{th}$-second gate line S2$i$, an $i^{th}$-third gate line S3$i$, an $i^{th}$-fourth gate line S4$i$, and an $i^{th}$ emission control line Ei may extend in the first direction DR1. In addition, in each of the $(i-1)^{th}$ pixel row Ri–1 and the $i^{th}$ pixel row Ri, a first to fourth power lines PL1 to PL4 may extend in the first direction DR1. A $k^{th}$ readout line RXk (or a $(j+1)^{th}$ data line Dj+1) may extend in a second direction DR2.

A sensor circuit (e.g., an $i^{th}$ sensor circuit SCi) including first to third sensor transistors M1 to M3 may be disposed (or formed) in the sensor circuit area.

The first sensor transistor M1 of the $i^{th}$ sensor circuit SCi may be connected to a second power line PL2 for providing a first initialization power voltage Vint1 through a first contact hole CNT1. In addition, the first sensor transistor M1 may extend toward the second sensor transistor M2.

The second sensor transistor M2 of the $i^{th}$ sensor circuit SCi may overlap the $(i-1)^{th}$-first gate line S1$i$–1 and may be connected to the $k^{th}$ readout line RXk through the second contact hole CNT2.

The third sensor transistor M3 of the $i^{th}$ sensor circuit SCi may overlap the $i^{th}$-fourth gate line S4$i$ and may be connected to the fourth power line PL4 through the third contact hole CNT3.

As described above, since a fifth power line PL5 for driving the $i^{th}$ sensor circuit SCi, an $i^{th}$ scan line SLi, and an $i^{th}$ reset line RSTLi are omitted, widths of the pixel rows Ri–1 and Ri in the second direction DR2 can be reduced, and a decrease in resolution of a display panel 100 can be minimized. In addition, when a data line (e.g., the $(j+1)^{th}$ data line Dj+1) is used as the $k^{th}$ readout line RXk, a width of the sensor circuit area in the first direction DR1 can be reduced, and the decrease in resolution of the display panel 100 can be minimized.

The third gate lines S3$i$–1 and S3$i$ may be used in common with the first gate lines S1$i$–1 and S1$i$, respectively, and in this case, the third gate lines S3$i$–1 and S3$i$ may be omitted.

Figure 6:
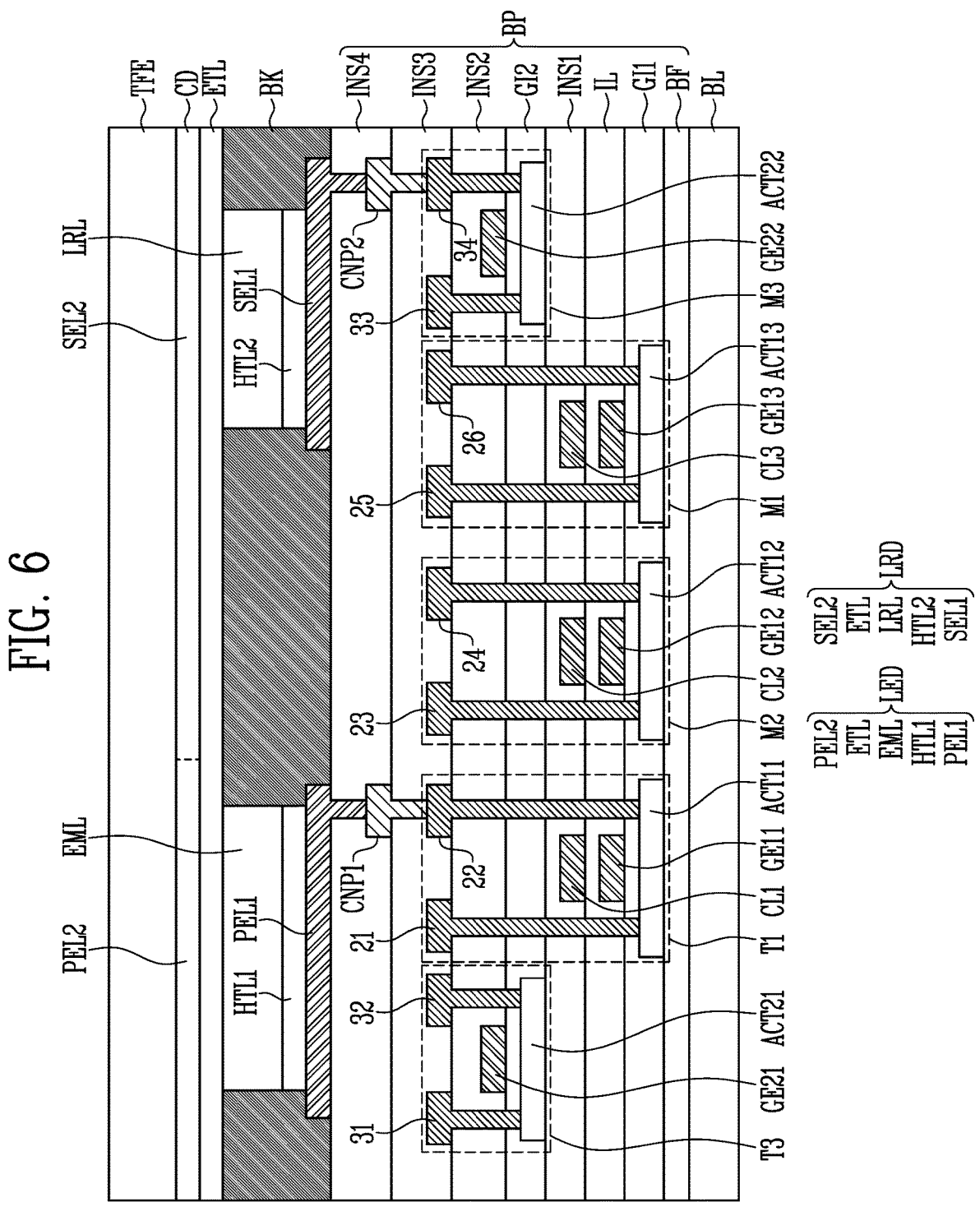
FIG. 6 is a cross-sectional diagram illustrating an example of the display area of FIG. 3.

FIG. 6 shows a cross-sectional view illustrating an example of the display area of FIG. 3.

Referring to FIGS. 1, 3, 4, and 6, pixel transistors T1 to T7 and sensor transistors M1 to M3 may be included in a backplane structure BP (or a circuit layer) of a display panel 100.

FIG. 6 illustrates a first pixel transistor T1, a third pixel transistor T3, a first sensor transistor M1, a second sensor transistor M2, and a third sensor transistor M3.

A base layer BL may be made of an insulating material such as glass or a resin. In addition, the base layer BL may be made of a material having flexibility to be bendable or foldable and may have a single-layered structure or a multi-layered structure.

The backplane structure BP including a pixel circuit PXC and a sensor circuit SC may be provided on the base layer BL. The backplane structure BP may include a semiconductor layer, a plurality of conductive layers, and a plurality of insulating layers which will be described below.

A buffer layer BF may be formed on the base layer BL. The buffer layer BF may prevent impurities from diffusing into the pixel transistors T1 to T7 and the sensor transistors M1 to M3. The buffer layer BF may be omitted according to the material and process conditions of the base layer BL.

First to third active patterns ACT11, ACT12, and ACT13 may be provided on the buffer layer BF. In an embodiment, the first to third active patterns ACT11, ACT12, and ACT13 may be made of a polysilicon semiconductor. For example, the first to third active patterns ACT11, ACT12, and ACT13 may be formed, for example, through an LTPS process.

A first gate insulating layer GI1 may be provided on the first to third active patterns ACT11, ACT12, and ACT13. The first gate insulating layer GI1 may be an inorganic insulating layer made of an inorganic material.

First to third gate electrodes GE11, GE12, and GE13 may be provided on the first gate insulating layer GI1. The first gate electrode Ge11 may overlap a channel region of the first active pattern ACT11, the second gate electrode GE12 overlaps a channel region of the second active pattern ACT12, and the third gate electrode GE13 may overlap a channel region of the third active pattern ACT13.

The first to third gate electrodes GE11, GE12, and GE13 may be formed of a metal. For example, the first to third gate electrodes GE11, GE12, and GE13 may be made of at least one selected from among metals such as gold (Au), silver (Ag), aluminum (Al), molybdenum (Mo), chromium (Cr), titanium (Ti), nickel (Ni), neodymium (Nd), and copper (Cu), or an alloy of the metals. In addition, the first to third gate electrodes GE11, GE12, and GE13 may be formed as a single layer or a multi-layer in which two or more materials of metals and alloys are stacked.

An interlayer insulating layer IL may be provided on the first to third gate electrodes GE11, GE12, and GE13. The interlayer insulating layer IL may be an inorganic insulating layer made of an inorganic material. As the inorganic material, polysiloxane, silicon nitride, silicon oxide, silicon oxynitride, or the like may be used.

Conductive patterns CL1, CL2, and CL3 may be provided on the interlayer insulating layer IL. The conductive patterns CL1, CL2, and CL3 may form at least one of one electrode of a storage capacitor Cst, gate lines S1i to S4i (and a scan line SLi and a reset line RSTLi), a data line Dj (and a readout line RXk), and power lines PL1 to PL4.

The conductive patterns CL1, CL2, and CL3 may be made of at least one selected from among metals such as gold (Au), silver (Ag), aluminum (Al), molybdenum (Mo), chromium (Cr), titanium (Ti), nickel (Ni), neodymium (Nd), and copper (Cu), or an alloy of the metals. In addition, the conductive patterns CL1, CL2, and Cl3 may be formed as a single layer, but the present disclosure is not limited thereto. The conductive patterns CL1, CL2, and Cl3 may be formed as a multi-layer in which two or more materials of metals and alloys are stacked.

A first insulating layer INS1 may be provided on the conductive patterns CL1, CL2, and CL3. The first insulating layer INS1 may be an inorganic insulating layer made of an inorganic material. As the inorganic material, polysiloxane, silicon nitride, silicon oxide, silicon oxynitride, or the like may be used.

A fourth active pattern ACT21 and a fifth active pattern ACT22 may be provided on the first insulating layer INS1. In an embodiment, the fourth and fifth active patterns ACT21 and ACT22 may be made of a polysilicon semiconductor.

For example, the fourth and fifth active patterns ACT21 and ACT22 may be formed through a metal oxide semiconductor forming process.

A second gate insulating layer GI2 may be provided on the fourth active pattern ACT21 and the fifth active pattern ACT22. The second gate insulating layer GI2 may be an inorganic insulating layer made of an inorganic material.

Fourth and fifth gate electrodes GE21 and GE22 may be provided on the second gate insulating layer GI2. The fourth gate electrode GE21 may overlap a channel region of the fourth active pattern ACT21, and the fifth gate electrode GE22 may overlap a channel region of the fifth active pattern ACT22.

A second insulating layer INS2 may be provided on the fourth and fifth gate electrodes GE21 and GE22. For example, the second insulating layer INS2 may be an inorganic insulating layer made of an inorganic material.

First source/drain electrodes 21 and 22, second source/drain electrodes 23 and 24, third source/drain electrodes 25 and 26, fourth source/drain electrodes 31 and 32, and fifth source/drain electrodes 33 and 34 may be provided on the second insulating layer INS2. The first to fifth source/drain electrodes 21, 22, 23, 24, 25, 26, 31, 32, 33, and 34 may be connected to the first to fifth active patterns ACT11, ACT12, ACT13, ACT21, ACT22 through contact holes.

The first to fifth source/drain electrodes 21, 22, 23, 24, 25, 26, 31, 32, 33, and 34 may be made of a metal.

A third insulating layer INS3 may be provided on the first to fifth source/drain electrodes 21, 22, 23, 24, 25, 26, 31, 32, 33, and 34. For example, the third insulating layer INS3 may be an inorganic insulating layer made of an inorganic material.

Connection patterns CNP1 and CNP2 may be provided on the third insulating layer INS3. A first connection pattern CNP1 may be connected to the first drain electrode 22 through a contact hole passing through the third insulating layer INS3. The second connection pattern CNP2 may be connected to the fifth drain electrode 34 (or the source electrode) through a contact hole passing through the third insulating layer INS3.

The connection patterns CNP1 and CP2 may be made of at least one selected from among metals such as gold (Au), silver (Ag), aluminum (Al), molybdenum (Mo), chromium (Cr), titanium (Ti), nickel (Ni), neodymium (Nd), and copper (Cu), or an alloy of the metals.

A fourth insulating layer INS4 may be disposed on the connection patterns CNP1 and CNP2. The fourth insulating layer INS4 may be an organic insulating layer made of an organic material or an inorganic insulating layer made of an inorganic material. In an embodiment, the fourth insulating layer INS4 may serve as a planarization layer.

A pixel layer including a first pixel electrode PEL1, a first sensor electrode SEL1, and a bank layer BK may be provided on the fourth insulating layer INS4.

The pixel layer may include a light-emitting element LED connected to the pixel circuit PXC and a light-receiving element LRD connected to the sensor circuit SC.

In an embodiment, the light-emitting element LED may include a first pixel electrode PEL1, a hole transport layer HTL1, a light-emitting layer EML, an electron transport layer ETL, and a second pixel electrode PEL2. In an embodiment, the light-receiving element LRD may include a first sensor electrode SEL1, a second hole transport layer HTL2, a light-receiving layer LRL, an electron transport layer ETL, and a second sensor electrode SEL2.

In an embodiment, the first pixel electrode PEL1 and the first sensor electrode SEL1 may be formed as a metal layer made of Ag, Mg, Al, Pt, Pd, Au, Ni, Nd, Ir, Cr, or an alloy thereof and/or may be made of indium tin oxide (ITO), indium zinc oxide (IZO), zinc oxide (ZnO), indium tin zinc oxide (ITZO), or the like. The first pixel electrode PEL1 may be connected to the first drain electrode 22 through a contact hole. The first sensor electrode SEL1 may be connected to the fifth drain electrode 34 through a contact hole.

The first pixel electrode PEL1 and the first sensor electrode SEL1 may be simultaneously formed through patterning using a mask.

The bank layer BK (or a pixel defining layer) which partitions a light-emitting area and a light-receiving area may be provided on the fourth insulating layer INS4 on which the first pixel electrode PEL1 and the first sensor electrode SEL1 are formed. The bank layer BK may be an inorganic insulating layer made of an inorganic material. The organic material may include an acrylic resin, an epoxy resin, a phenolic resin, a polyamide resin, a polyimide resin, and the like.

In addition, the bank layer BK may include a light absorbing material or may serve to absorb light introduced from the outside by applying a light absorbing material thereon. For example, the bank layer BK may include a carbon-based black pigment. However, the present disclosure is not limited thereto, and the bank layer BK may include an opaque metallic material such as chromium (Cr), molybdenum (Mo), an alloy of molybdenum and titanium (MoTi), tungsten (W), vanadium (V), niobium (Nb), tantalum (Ta), manganese (Mn), cobalt (Co) or nickel which has high light absorbance.

The bank layer BK may include openings corresponding to the light-emitting area and the light-receiving area.

The first hole transport layer HTL1 may be provided on an upper surface of the first pixel electrode PEL1 exposed by the bank layer BK, and the second hole transport layer HTL2 may be provided on an exposed upper surface of the first sensor electrode SEL1. Holes may move to the light-emitting layer EML through the first hole transport layer HTL1, and holes may move to the light-receiving layer LRL through the second hole transport layer HTL2.

In an embodiment, the first hole transport layer HTL1 and the second hole transport layer HTL2 may be the same or different according to materials of the light-emitting layer EML and the light-receiving layer LRL.

The light-emitting layer EML may be provided on the first hole transport layer HTL1. In an embodiment, the light-emitting layer EML may be formed as an organic light-emitting layer. According to an organic material included in the light-emitting layer EML, the light-emitting layer EML may emit light such as red light, green light, or blue light.

In an embodiment, an electron blocking layer may be provided on the second hole transport layer HTL2 in the light-receiving area. The electron blocking layer may prevent electric charges of the light-receiving layer LRL from being transferred to the second hole transporting layer HTL2. In an embodiment, the electron blocking layer may be omitted.

The light-receiving layer LRL may be disposed on the second hole transport layer HTL2. The light-receiving layer LRL may detect an intensity of light by emitting electrons in response to light having a specific wavelength band.

In an embodiment, the light-receiving layer LRL may include a low molecular weight organic material. For example, the light-receiving layer LRL may be made of a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn).

Alternatively, the light-receiving layer LRL may be formed as a bi-layer including a layer including a C60 and a layer made of the low molecular weight organic material included in the light-receiving layer LRL such as a phthalocyanine compound including at least one metal selected from the group consisting of copper (Cu), iron (Fe), nickel (Ni), cobalt (Co), manganese (Mn), aluminum (Al), palladium (Pd), tin (Sn), indium (In), lead (Pb), titanium (Ti), rubidium (Rb), vanadium (V), gallium (Ga), terbium (Tb), cerium (Ce), lanthanum (La), and zinc (Zn), or the light-receiving layer LRL may be formed as one mixing layer in which a phthalocyanine compound and C60 are mixed.

However, this is merely an example, and the light-receiving layer LRL may include a polymer organic layer.

In an embodiment, in the light-receiving layer LRL, a light detection band of the optical sensor may be determined by controlling selection of a metal component included in a phthalocyanine compound. For example, a phthalocyanine compound including copper absorbs a visible light wavelength of about 600 to 1,000 nm, and a phthalocyanine compound including tin (Sn) absorbs a near infrared wavelength of about 800 to 1,000 nm. Therefore, by controlling selection of a metal included in a phthalocyanine compound, it is possible to implement an optical sensor capable of detecting a wavelength in a band desired by a user. For example, the light-receiving layer LRL may be formed to selectively absorb a wavelength in a red light band, a wavelength in a green light band, or a wavelength in a blue light band.

In an embodiment, an area of the light-receiving area may be smaller than the area of the light-emitting area.

The second pixel electrode PEL2 and the second sensor electrode SEL2 may be provided on the electron transport layer ETL. In an embodiment, the second pixel electrode PEL2 and the second sensor electrode SEL2 may be a common electrode CD integrally formed in a display area AA. A second power voltage VSS may be supplied to the second pixel electrode PEL2 and the second sensor electrode SEL2.

The common electrode CD may be formed as a metal layer made of Ag, Mg, Al, Pt, Pd, Au, Ni, Nd, Ir, or Cr and/or a transparent conductive layer made of ITO, IZO, ZnO, or ITZO. In an embodiment, the common electrode CD may be formed as a multi-layer including two or more layers which includes a thin metal layer, for example, a triple layer of ITO/Ag/ITO.

An encapsulation layer TFE may be provided on the common electrode CD including the second pixel electrode PEL2 and the second sensor electrode SEL2. The encapsulation layer TFE may be formed as a single layer or may be formed as a multi-layer. In an embodiment, the encapsulation layer TFE may have a stacked structure in which an inorganic material, an organic material, and an inorganic material are sequentially deposited. An uppermost layer of the encapsulation layer TFE may be made of an inorganic material.

Figure 7:
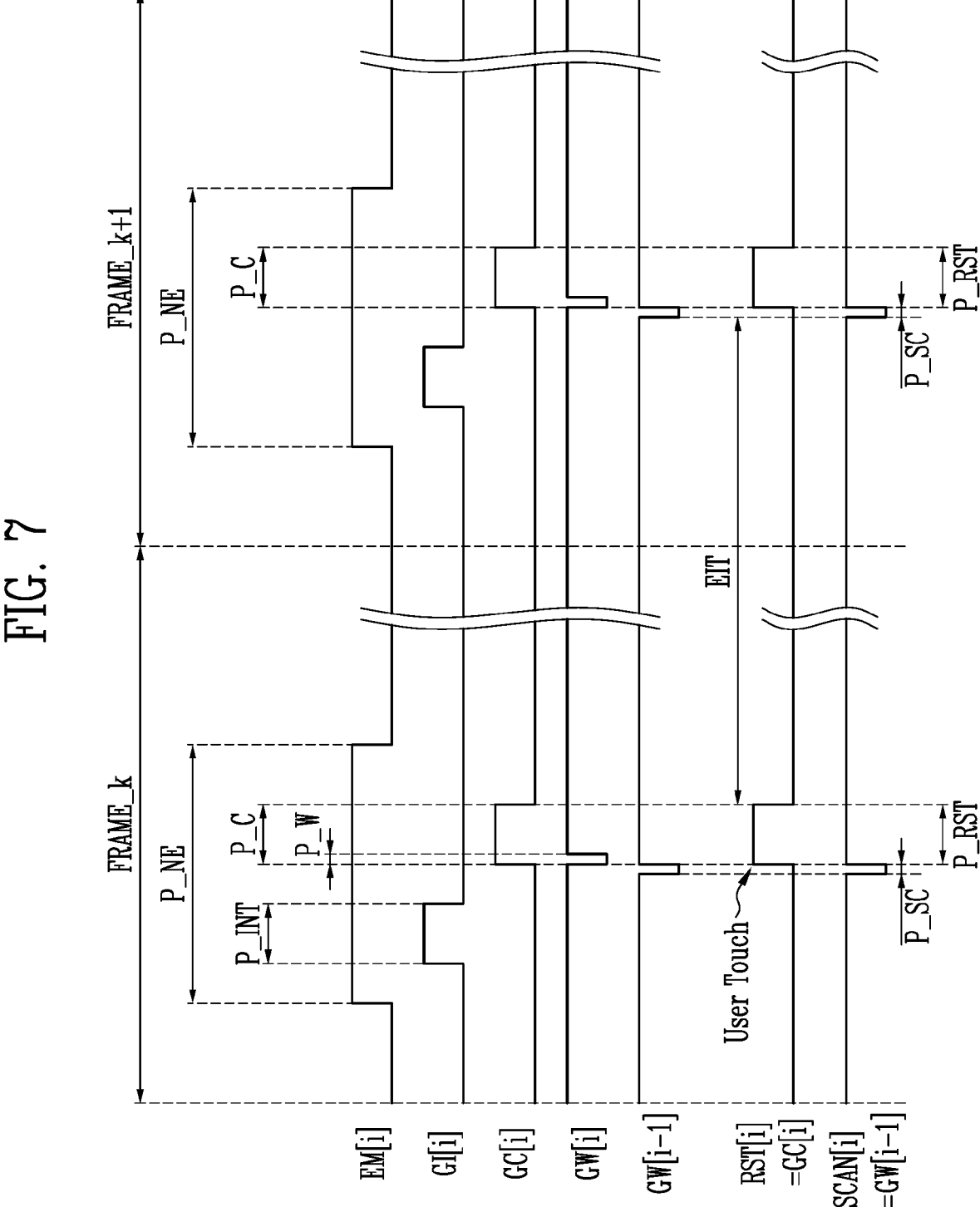
FIG. 7 is a waveform diagram for describing an embodiment of the operation of a pixel and an optical sensor of FIG. 4.

FIG. 7 shows a waveform for describing an embodiment of the operation of the pixel and the optical sensor of FIG. 4.

Referring to FIGS. 1, 4, and 7, an emission control signal EM[i] may be provided to an $i^{th}$ emission control line Ei, a second gate signal GI[i] may be provided to an $i^{th}$-second gate line S2$i$, a fourth gate signal Gc[i] may be provided to an $i^{th}$-fourth gate line S4$i$, and a first gate signal GW[i] may be provided to an $i^{th}$ first gate line S1$i$. A previous first gate signal GW[i−1] may be provided to an (i−1)th-first gate line S1$i$−1. A reset signal RST[i] may be provided to an $i^{th}$ reset line RSTLi, and since the $i^{th}$-fourth gate line S4$i$ is shared, the reset signal RST[i] may be the same as the fourth gate signal GC[i]. A scan signal SCAN[i] may be provided to an $i^{th}$ scan line Sli, and since the $i^{th}$ scan line SLi and the (i−1)$^{th}$-first gate line S1$i$−1 are shared, the scan signal SCAN[i] may be the same as the previous first gate signal GW[i−1].

A $k^{th}$ frame period FRAME_k may include a non-emission period P_NE, and the non-emission period P_NE (or the $k^{th}$ frame period FRAME_k) may include an initialization period P_INT, a compensation period P_C, and a writing period P_W. The writing period P_W may be included in the compensation period P_C. For example, the writing period P_W may be horizontal time, and each of the initialization period P_INT and the compensation period P_C is six horizontal times.

In the non-emission period P_NE, the emission control signal EM[i] may have a high level. In this case, in response to the emission control signal Em[i] having a high level, a fifth pixel transistor T5 and a sixth pixel transistor T6 may be turned off, and a pixel PX need not emit light.

In the initialization period P_INT, the second gate signal GI[i] may have a high level. In this case, in response to the second gate signal Gi[i], having a high level, a fourth pixel transistor T4 may be turned on, and a first initialization power voltage Vint1 of a second power line PL2 may be provided to a first node (or a gate electrode of a first pixel transistor T1).

Thereafter, in the writing period P_W, the fourth gate signal GC[i] may have a high level, and the first gate signal GW[i] may have a low level. In this case, in response to the first gate signal Gw[i] having a low level, a second pixel transistor T2 may be turned on, and a data signal may be provided from a data line Dj to a second node N2. In addition, in response to the fourth gate signal Gc[i] having a high level, a third pixel transistor T3 may be turned on, and the data signal may be transmitted from the second node N2 to the first node N1 through the first pixel transistor T1 and a third pixel transistor T3.

During the compensation period P_C, the fourth gate signal GC[i] may have a high level. Since the first pixel transistor T1 remains a diode-connected form by the turned-on third pixel transistor T3, the first node N1 may have a voltage in which a threshold voltage of the first pixel transistor T1 is compensated for with the data signal.

Thereafter, the non-emission period P_NE ends, and the emission control signal EM[i] may have a low level. In this case, in response to the emission control signal Em[i] having a low level, the fifth pixel transistor T5 and the sixth pixel transistor T6 may be turned on, a current movement path may be formed from a first power line PL1 to an electrode EP through the fifth pixel transistor T5, the first pixel transistor T1, the sixth pixel transistor T6, and a light-emitting element LED, a driving current corresponding to a voltage (e.g., the data signal) of the first node N1 may flow through the light-emitting element LED according to the operation of the first pixel transistor T1, and the light-emitting element LED may emit light with luminance corresponding to the driving current. The light-emitting element LED may maintain an emission state until a non-emission period P_NE of a (k+1)$^{th}$ frame period FRAME_k+1.

In a scan period P_SC of the $k^{th}$ frame period FRAME_k, the previous first gate signal GW[i−1] may have a low level. A second sensor transistor M2 may be turned on in response to the previous first gate signal GW[i−1]. When a voltage of the fifth node N5 is changed by a light-receiving element LRD, according to the operation of a first sensor transistor M1, a current (or a detection value) may flow a fifth power line PL5 (or the second power line PL2) to a readout line RXk (or the data line Dj) in response to the voltage of the fifth node N5. The scan period P_SC may be earlier than the compensation period P_C.

A reset period P_RST may be the same as the compensation period P_C. In the reset period P_RST, a third sensor transistor M3 may be turned on in response to the fourth gate signal Gc[i] having a high level, and a reset voltage VGL may be applied to the fifth node N5. The voltage of the fifth node N5 may be reset by the reset voltage VGL.

Thereafter, the reset period P_RST (or the compensation period P_C) may end, and the fourth gate signal GC[i] may have a low level. During a period (e.g., an exposure time EIT) immediately before a reset period P_RST of a (k+1)$^{th}$ frame period FRAME_k+1 starts immediately after the reset period P_RST of the $k^{th}$ frame period FRAME_k ends, the fourth gate signal GC[i] may be maintained at a low level.

When light is incident on the light-receiving element LRD during the exposure time EIT, the voltage of the fifth node N5 may be changed due to a photoelectric conversion function of the light-receiving element LRD.

In a scan period P_SC of the (k+1)$^{th}$ frame period FRAME_k+1, the previous first gate signal GW[i−1] may have a low level. In response to the previous first gate signal GW[i−1], the second sensor transistor M2 may be turned on, and a current (or a detection value) corresponding to the voltage of the fifth node N5 may flow from the fifth power line PL5 (or the second power line PL2) to the readout line RXk (or the data line Dj).

For example, in the reset period P_RST of the K$^{th}$ frame period FRAME_k (or before the reset period P_RST), when a user touch input is generated on a display panel 100, a current corresponding to light reflected by a user (e.g., a user's finger), that is, a detection value, may be output in the K$^{th}$ frame period FRAME_k. For example, a user's fingerprint may be detected based on the detection value. Since the exposure time EIT corresponding to one frame period is secured, fingerprint detection can be performed relatively accurately.

In particular, when the display panel 100 is driven at a relatively low refresh rate (driving frequency or scan rate) a more sufficient exposure time EIT can be secured. For example, when the display panel 100 is driven at a refresh rate of 10 Hz, the exposure time EIT of about 100 ms can be secured in response to one frame period (e.g., 1/refresh rate). As another example, when the display panel 100 is driven at a refresh rate of 20 Hz, the exposure time EIT of about 50 ms can be secured in response to one frame period.

In FIG. 7, it has been described that the reset signal RST[i] may be the same as the fourth gate signal GC[i], and the scan signal SCAN[i] may be the previous first gate signal Gw[i−1], but the present disclosure is not limited thereto.

For example, in a range in which a reset operation of an optical sensor PHS by the reset signal RST[i] is performed after a detection value output operation of the optical sensor PHS by the scan signal SCAN[i], the reset signal RST[i] and the scan signal SCAN[i] may be changed. For example, the scan signal SCAN[i] may be the same as the first gate signal Gw[i], and the reset signal RST[i] may be the same as a fourth gate signal provided to a fourth gate line after the fourth gate line S4$i$ (e.g., an (i+1)$^{th}$-fourth gate line "S4$i$+1", a (i+2)$^{th}$-fourth gate line "S4$i$+2", or the like). As another example, the reset signal RST[i] may be the same as the fourth gate signal GC[i], the scan signal SCAN[i] may be the same as a first gate signal provided to a first gate line before (i−1)$^{th}$-first gate line S1$i$−1 (e.g., an (i−2)$^{th}$-first gate line "S1$i$−2", an (i−3)$^{th}$-first gate line "S1$i$−3", or the like).

Figure 8:
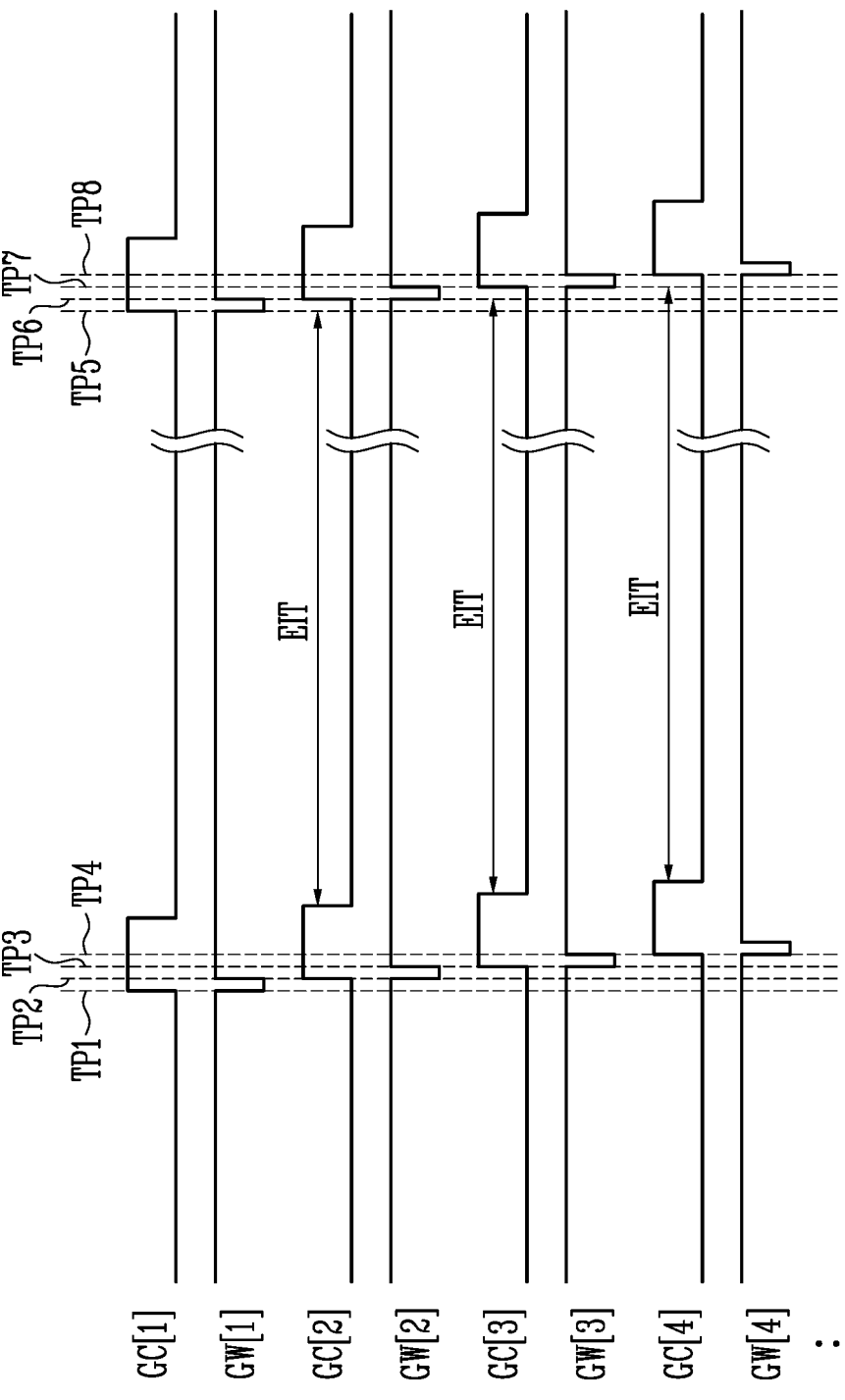
FIG. 8 is a waveform diagram for describing an embodiment of the operation of the display panel of FIG. 2.

FIG. 8 shows a waveform for describing an embodiment of the operation of the display panel of FIG. 2.

Referring to FIGS. 1, 2, 4, 7, and 8, fourth gate signals GC[1], GC[2], GC[3], and GC[4] are sequentially provided to fourth gate lines, and first gate signals GW[1], GW[2], GW[3], and GW[4] may be sequentially provided to first gate lines. For example, at a first time point TP1, a fourth gate signal GC[1] and a first gate signal GW[1] may be respectively provided to a fourth gate line and a first gate line of a first pixel row R1, at a second time point TP2, a fourth gate signal GC[2] and a first gate signal GW[2] may be respectively provided to a fourth gate line of a second pixel row R2 and a first gate line of the second pixel row R2, at a third time point TP3, a fourth gate signal GC[3] and a first gate signal GW[3] may be respectively provided to a fourth gate line of a third pixel row R3 and a first gate line of the third pixel row R3, and at a fourth time point TP4, a fourth gate signal GC[4] and a first gate signal GW[4] may be provided to a fourth gate line of a fourth pixel row R4 and a first gate line of the fourth pixel row.

For example, it is assumed that a reset line (e.g., an i$^{th}$ reset line RSTLi (see FIG. 4)) and a fourth gate line (e.g., an i$^{th}$-fourth gate line S4$i$ (see FIG. 4)) are shared, and a scan line (e.g., an i$^{th}$ scan line Sli (see FIG. 4)) and a first gate line (e.g., an (i−1)$^{th}$-first gate line S1$i$−1 (see FIG. 4)) are shared.

In this case, sensor circuits SC21 to SC24 of the second pixel row R2 may be operated bed on the first gate signal GW[1] of the first pixel row R1 and the fourth gate signal GC[2] of the second pixel row R2. At a fifth time point TP5, each of the sensor circuits SC21 to SC24 of the second pixel row R2 may output a detection value corresponding to a light incident during an exposure time EIT.

Similarly, sensor circuits SC31 to SC34 of the third pixel row R3 may be operated based on the first gate signal GW[2] of the second pixel row R2 and the fourth gate signal GC[3] of the third pixel row R3. At a sixth time point TP6, each of the sensor circuits SC31 to SC34 of the third pixel row R3 may output a detection value corresponding to a light incident during the exposure time EIT.

Sensor circuits SC41 to SC44 of the fourth pixel row R4 may be operated based on the first gate signal GW[3] of the third pixel row R3 and the fourth gate signal GC[4] of the fourth pixel row R4. At a seventh time point TP7, each of the sensor circuits SC41 to SC44 of the fourth pixel row R4 may output a detection value corresponding to a light incident during the exposure time EIT. At an eighth time point TP8, the fourth gate signal GC[4] and the first gate signal GW[4] may be provided to the fourth gate line and the first gate line of the fourth pixel row R4, respectively.

That is, each of the sensor circuits SC11 to SC44 may output a detection value corresponding to the same exposure time EIT.

Figure 9A:
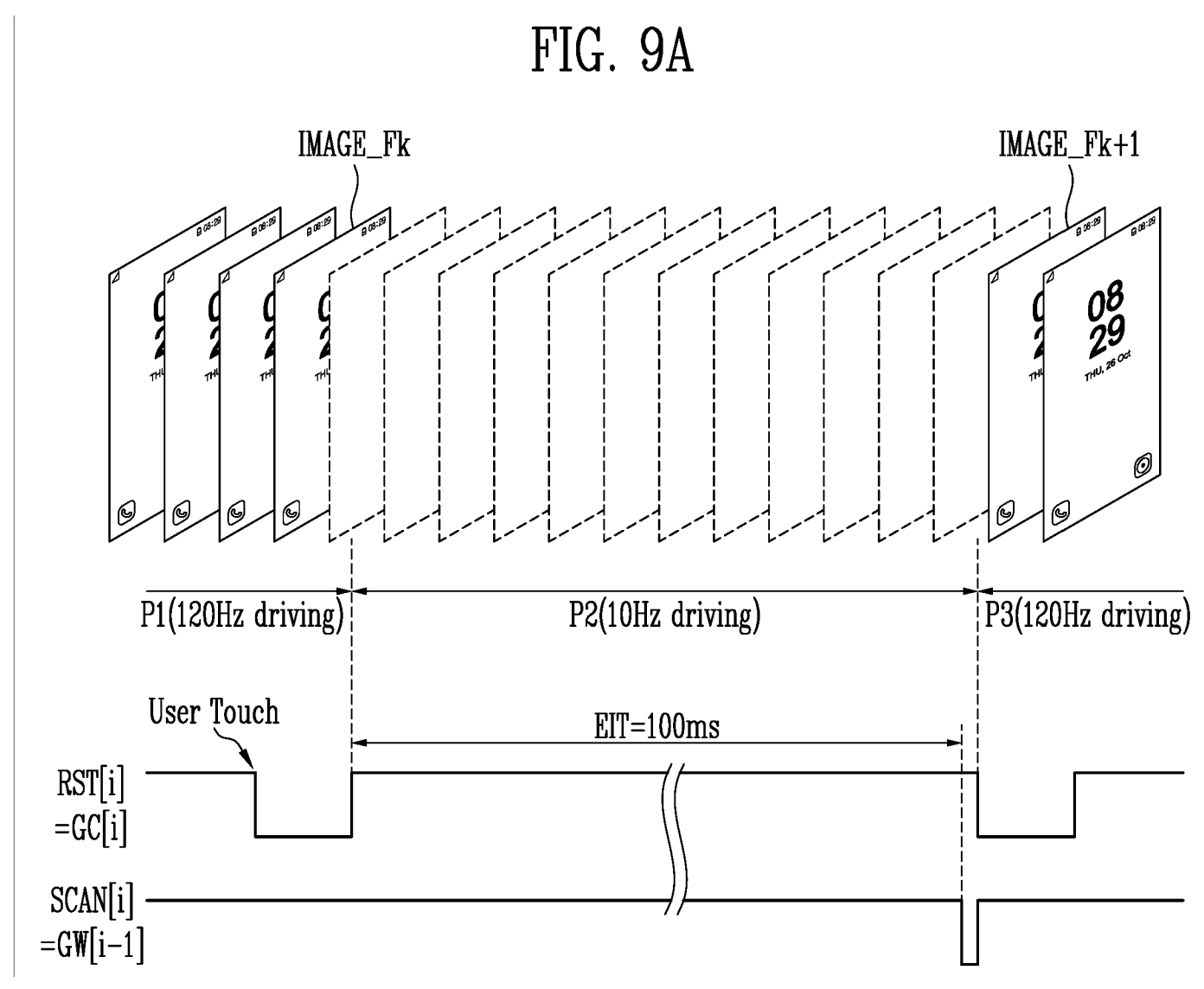
Figure 9B:
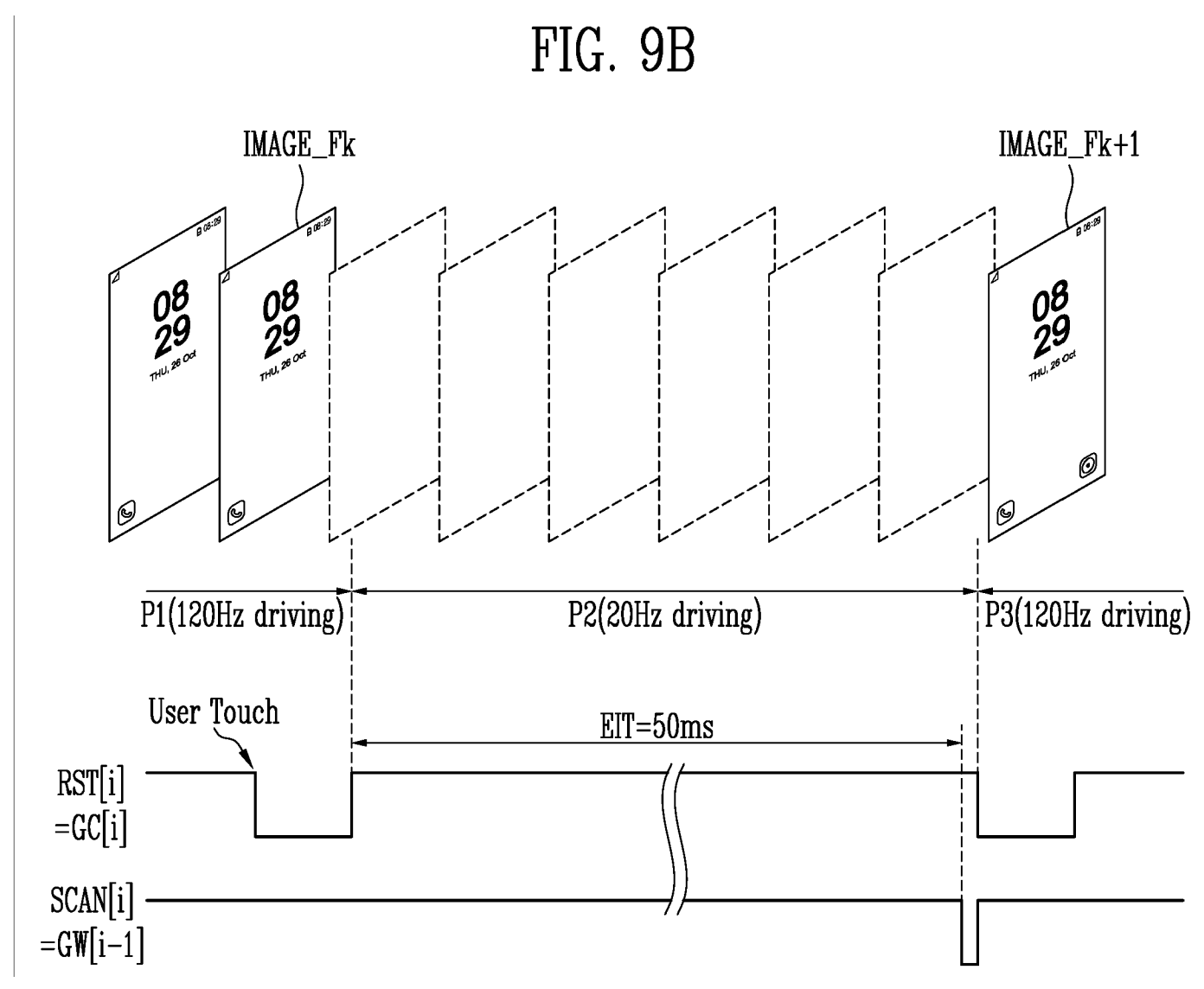
Figure 9C:
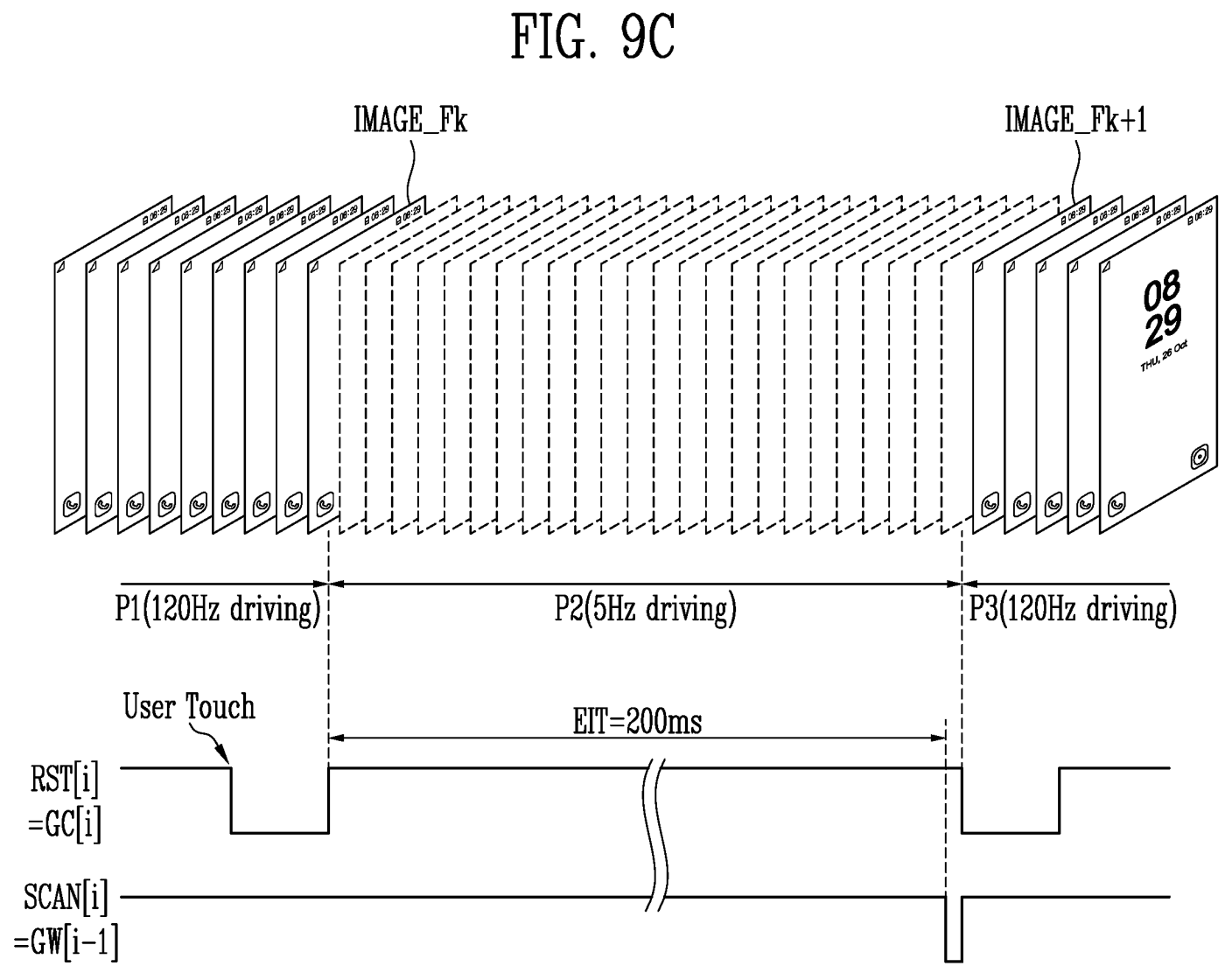

FIGS. 9A, 9B, and 9C are used for describing an embodiment of a display device of FIG. 1.

Referring to FIGS. 1, 4, 7, 9A, 9B, and 9C, in a period in which fingerprint detection need not be performed, a display panel 100 may be driven or may display an image at a first refresh rate (or a first driving frequency). In a period in which fingerprint detection is performed, the display panel 10 may be driven or may display an image at a second refresh rate (or a second driving frequency).

Referring to FIG. 9A, for example, in a first period P1 in which fingerprint detection need not be performed, the display panel 100 may be driven at a first refresh rate of 120 Hz. The display panel 100 may display frame images at the first refresh rate of 120 Hz. When a user touch is input (or when fingerprint detection is requested), the display panel 100 may display a K$^{th}$ frame image IMAGE_Fk including a specific pattern (e.g., a full-white image) for fingerprint detection.

Thereafter, in a second section P2 in which fingerprint detection is performed, the display panel 100 may be driven at a second refresh rate of 10 Hz. For example, during the second period P2, when the display panel 100 is driven at the first refresh rate of 120 Hz, 12 frame images to be displayed may be skipped. A state in which the K$^{th}$ frame image IMAGE_Fk is displayed on the display panel 100 may be maintained during the second period P2. In this case, an exposure time EIT of about 100 ms may be secured.

Thereafter, in a third period P3 in which fingerprint detection need not be performed, the display panel 100 may be driven at the first refresh rate of 120 Hz, and the display panel 100 may display frame images at the first refresh rate of 120 Hz.

As another example, as shown in FIG. 9B, in the first period P1, the display panel 100 may be driven at the first refresh rate of 120 Hz. When a user touch is input, the display panel 100 may display the K$^{th}$ frame image IMAGE_Fk including a specific pattern for fingerprint detection. In the second section P2, the display panel 100 may be driven at the second refresh rate of 20 Hz. For example, during the second period P2, when the display panel 100 is driven at the first refresh rate of 120 Hz, six frame images to be displayed may be skipped. A state in which the K$^{th}$ frame image IMAGE_Fk is displayed on the display panel 100 may be maintained during the second period P2. In this case, the exposure time EIT of about 50 ms may be secured.

As still another example, as shown in FIG. 9C, in the second section P2, the display panel 100 may be driven at the second refresh rate of 5 Hz. In this case, when the display panel 100 is driven at the first refresh rate of 120 Hz, 24 frame images to be displayed may be skipped, and the exposure time EIT of about 200 ms may be secured.

As described above, for fingerprint detection, the display panel 100 (or a display device 1000) may be driven while a refresh rate is changed. Although it has been described that the second refresh rate is 10 Hz, 20 Hz, or 5 Hz in FIGS. 9A, 9B, and 9C, the second refresh rate is not limited thereto, and the second refresh rate may be variously changed according to the desired exposure time EIT. In addition, although it has been described that the first refresh rate is 120 Hz, the present disclosure is not limited thereto, and the first refresh rate may be variously changed according to a product.

Figure 10:
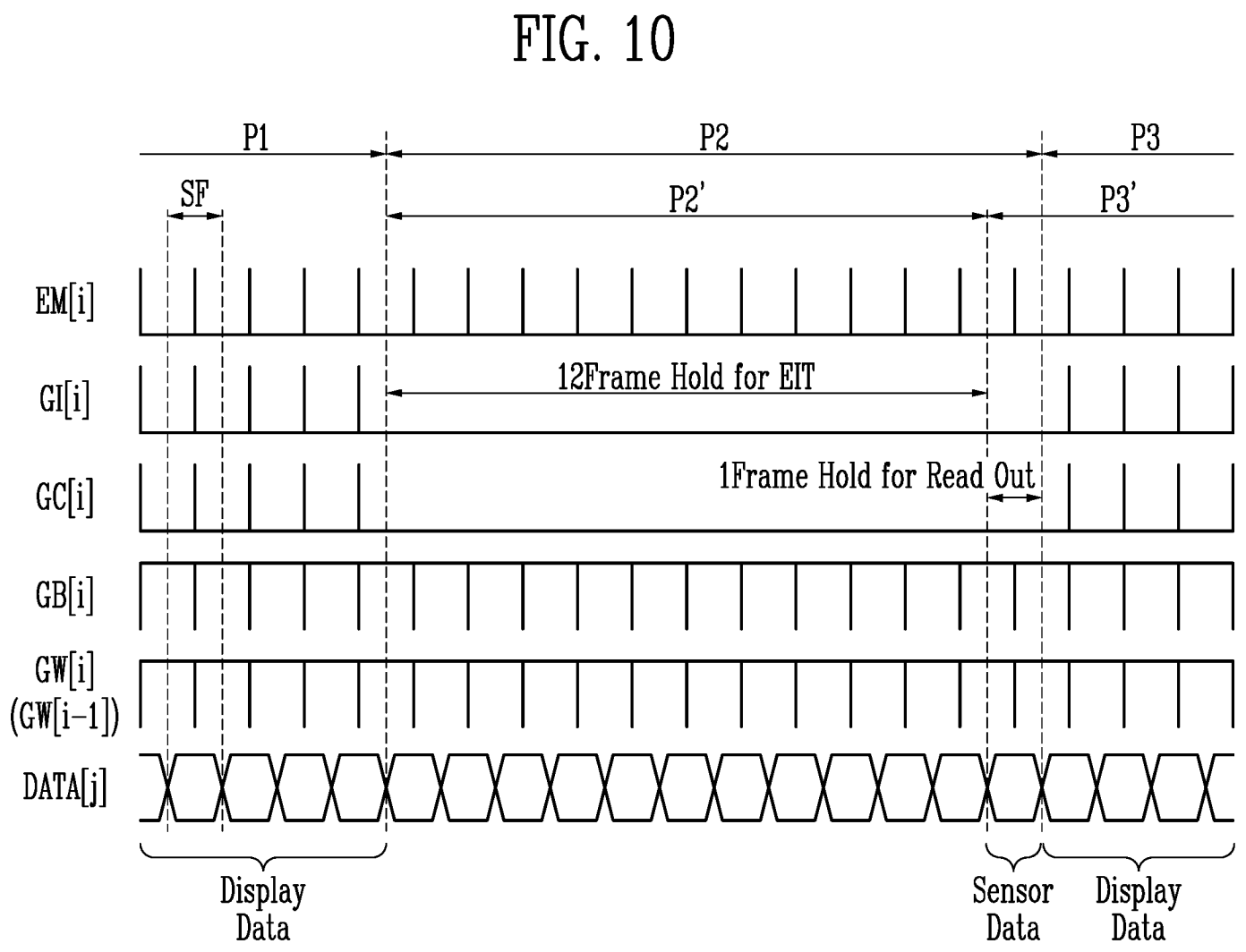

FIG. 10 shows a waveform for describing an embodiment of the operation of the pixel and the optical sensor of FIG. 4.

Referring to FIGS. 1, 4, 7, 9A, and 10, an emission control signal EM[i] may be provided to an i$^{th}$ emission control line Ei, a second gate signal GI[i] may be provided to an i$^{th}$-second gate line S2$i$, a fourth gate signal GC[i] may be provided to an $i^{th}$-fourth gate line S4$i$, a third gate signal GB[i] may be provided to an $i^{th}$-third gate line S3$i$, and a first gate signal GW[i] may be provided to an $i^{th}$-first gate line S1$i$. A data signal DATA[j] may be a signal provided to a $j^{th}$ data line Dj or a signal measured in the $j^{th}$ data line Dj. Since an $i^{th}$ reset line RSTLi and the $i^{th}$-fourth gate line S4$i$ are shared, the fourth gate signal GC[i] may be provided to the $i^{th}$ reset line RSTLi. Since an $i^{th}$ scan line SLi and the $i^{th}$-first gate line S1$i$–1 are shared, the first gate signal GW[i–1] may be provided to the $i^{th}$ scan line SLi. When the $j^{th}$ data line Dj and a $k^{th}$ readout line RXk are shared, the data signal DATA[j] may include a detection value (current and/or voltage) output from an optical sensor PHS.

The emission control signal EM[i] may have a high level (or a high level pulse) at a cycle of a specific time in first to third periods P1 to P3. For example, the specific time may correspond to one frame period (or a sub-frame period SF) when the display apparatus 1000 is driven at a maximum driving frequency (e.g., 120 Hz). Similarly, each of the third gate signal GB[i] and the first gate signal GW[i] may have a low level (or a low level pulse) at a cycle of the specific time in the first to third periods P1 to P3. In order to prevent luminance from being lowered when the display device 1000 is driven at a low frequency, the third gate signal GB[i] and the first gate signal GW[i] (and the emission control signal EM[i]) may have a pulse at a cycle of the specific time.

The emission control signal EM[i] may have a high level (or a high level pulse) in a cycle of the specific time in the first to third periods P1 to P3. For example, the specific time may correspond to one frame period (or a sub-frame period SF) when the display apparatus 1000 is driven at a maximum driving frequency (e.g., 120 Hz). Similarly, each of the third gate signal GB[i] and the first gate signal GW[i] may have a low level (or a low level pulse) at a cycle of the specific time in the first to third periods P1 to P3. In order to prevent luminance from being lowered when the display device 1000 is driven at a low frequency, the third gate signal GB[i] and the first gate signal GW[i] (and the emission control signal EM[i]) may have a pulse at a cycle of the specific time.

The second gate signal GI[i] and the fourth gate signal GC[i] may have a high level (or a high level pulse) at a cycle of the specific time in the first period P1 and the third period P3, and the second gate signal GI[i] and the fourth gate signal GC[i] (or a high level pulse) may be skipped in the second period P2, For example, each of the second gate signal GI[i] and the fourth gate signal GC[i] may be maintained (or held) at a low level during 12 frame periods corresponding to the second period P2.

In the first period P1 and the third period P3, in response to the second gate signal GI[i] and the fourth gate signal GC[i], a pixel PX may normally perform an initialization operation and a compensation operation and may emit light at luminance corresponding to the data signal DATA[j] (or display data) or display an image. In the second period P2, the pixel PX need not perform an initialization operation and a compensation operation and thus may emit light at luminance corresponding to the data signal DATA[j] (or display data) provided (or stored) immediately before the second period P2 or display an image.

Since the fourth gate signal GC[i] (or the high level pulse) is skipped in the second period P2, the exposure time EIT for the optical sensor PHS may be secured. In response to the first gate signal GW[i], the optical sensor PHS may output a detection value for each frame period, and a driving circuit 200 (see FIG. 1) (or a sensor driver 220) may selectively acquire or sample the detection value. For example, in a last frame period of the second period P2, the driving circuit 200 (see FIG. 1) (or the sensor driver 220) may acquire the data signal DATA[j] as the detection value (e.g., sensor data corresponding to light sufficiently received during the exposure time EIT).

As described above, when the $j^{th}$ data line Dj and the $k^{th}$ readout line RXk are shared, even in a period in which a detection value (or sensor data) is output, the display device 1000 may be driven at a second refresh rate (or a low frequency).

On the other hand, when the $j^{th}$ data line Dj and the $k^{th}$ readout line RXk are not shared, a period in which a detection value is output is included in a third section P3' rather than a second section P2', and the display device 1000 may be driven at the second refresh rate (or the low frequency) in the second period P2' and may be driven at a first refresh rate in the third period P3'.

Figure 11:
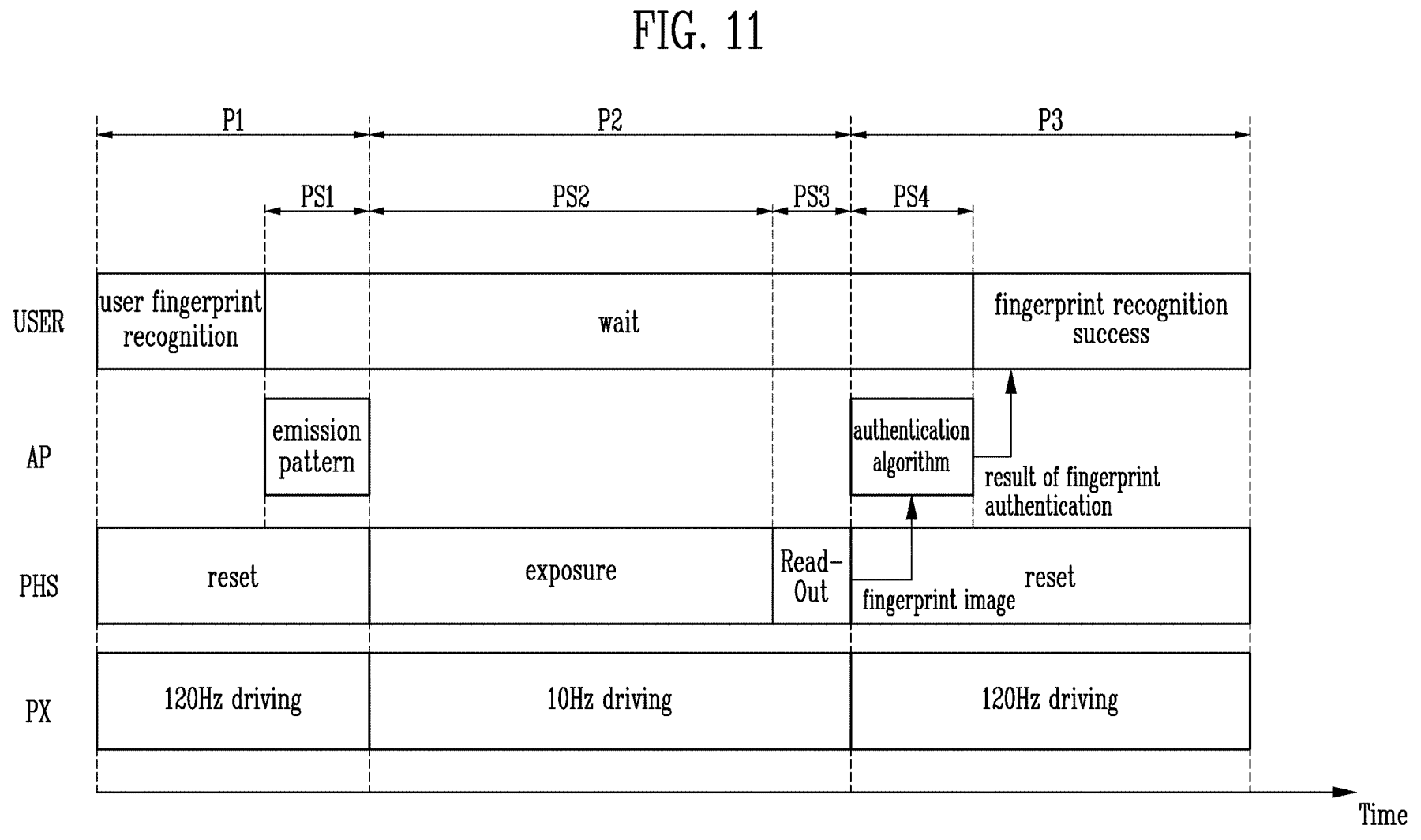

FIG. 11 is used for describing a method of driving a display device according to an embodiment of the present disclosure.

Referring to FIGS. 1, 4, 7, 10, and 11, the method of driving a display device may be performed in a display device 1000. The display device 1000 may include pixels PX and optical sensors PHS, and as described with reference to FIG. 4, the pixels PXs and the optical sensors PHS may share scan lines.

In a first period P1, the display device 1000 may be driven at a first refresh rate (or a first driving frequency).

For example, in the first period P1, the display device 1000 may scan the pixels PX and the optical sensors PHS at the first refresh rate. For example, the pixel PX may emit light at a frequency of 120 Hz, and the optical sensor PHS may be reset to a frequency of 120 Hz.

When an input for fingerprint recognition is generated by a user in a first sub-period PS1, for example, a user touch may be input to the display panel 100. In this case, in the first sub-period PS1, an external device AP (e.g., an application processor or a graphic processor) may control a driving circuit 200 (or a panel driver 210) to display an emission pattern for fingerprint detection (e.g., a full-white image) on the display panel 100 or may provide input image data including the emission pattern the driving circuit 200. The panel driver 210 may provide a data signal corresponding to the emission pattern or the input image data to the display panel 100 and the display panel 100 may display a frame image (or an image for fingerprint detection) including the emission pattern.

Thereafter, in a second section P2 in which fingerprint detection is performed, the display device 1000 may be driven at a second refresh rate.

For example, in the first period P2, the display device 1000 may scan the pixels PX and the optical sensors PHS at the second refresh rate. For example, during the second period P2, the display panel 100 may be driven at the second refresh rate of 10 Hz and may maintain a frame image (i.e., a frame image including the emission pattern) displayed in the first sub period PS1 without refreshing a frame image.

In this case, the light sensor PHS in the display panel 100 may be exposed to light reflected from the emitting pattern by an object (e.g., a user's finger) during the second period P2, or alternatively during a second sub-period PS2 or an exposure time EIT, and may output a detection value (e.g., current and/or voltage) corresponding to the reflected light.

During the second sub-period PS2, the driving circuit 200 (or the sensor driver 220) need not acquire (or sample) a detection value, and in a third sub-period PS3 after the sufficient exposure time EIT has elapsed, the driving circuit 200 may read out (sample, or receive) a detection value. In other words, the detection value of the optical sensor PHS may be read out in the third sub-period PS3.

Thereafter, in a third period P3, the display panel 100 (or the display device 1000) may be driven again at the first refresh rate. For example, as in the first period P1, the pixel PX may emit light at a frequency of 120 Hz, and the optical sensor PHS may be reset to a frequency of 120 Hz.

The driving circuit 200 (or the sensor drier 220) or the external device AP may perform fingerprint authentication based on the detection value read out (or sampled) in the third sub-period PS3. For example, in the third sub-period PS3, the detection value output from the optical sensor PHS in the display panel 100 may be provided to the external device AP through the driving circuit 200 in the form of an image (e.g., a fingerprint image), and the external device AP may perform fingerprint authentication using an authentication algorithm (e.g., an algorithm for authenticating a fingerprint through a method of comparing a fingerprint image with a fingerprint template stored or registered in advance).

The driving circuit 200 (or the external device AP) may display an image corresponding to a result of the fingerprint authentication through the display panel 100, and a user may check whether the fingerprint authentication is successful.

A display device according to embodiments of the present disclosure can include a light-emitting pixel and a sensor pixel, the light-emitting pixel and the sensor pixel can share at least one selected from a power line, a gate line (or a scan line), and a data line (or a readout line). In this case, the number of lines disposed in the display device can be relatively reduced, and a decrease in resolution due to lines (e.g., relatively many lines) can be minimized.

In a display device and a method of driving the display device according to embodiments of the present disclosure, a more sufficient exposure time for a sensor pixel can be secured by changing a driving frequency (a refresh rate or a scan rate) when a fingerprint is detected. Accordingly, fingerprint detection (or fingerprint recognition) can be performed more accurately.

The present disclosure is not limited to the embodiments set forth herein, and more diverse embodiments are covered by the present specification.

The technical spirit of the present disclosure has been described according to the embodiments, but it is to be noted that the embodiments are provided for the description thereof by way of example, and are not for the limitation thereof. Further, those of ordinary skill in the pertinent art will appreciate that various modifications may be made without departing from the scope and spirit of the present disclosure.

The scope of the present disclosure should not be limited to the contents described in the detailed description of the specification, but should be defined by the claims. It shall be understood that modifications and variations conceived from the meaning and scope of the claims and equivalents thereof are included within the scope of the present disclosure.

What is claimed is:

1. A display device comprising:
a light-emitting pixel; and
a sensor pixel,
wherein the light-emitting pixel includes:
a light-emitting element connected to a second line;
a first transistor connected between a first line and the light-emitting element and configured to control a driving current flowing through the light-emitting element in response to a voltage of a first node, and a second transistor connected between the first node and a third line; and
wherein the sensor pixel includes:
a light-receiving element connected between a sensor node and the second line, and
a first sensor transistor configured to control a current flowing between the third line and a readout line in response to a voltage of the sensor node.

2. The display device of claim 1, wherein:
the light-emitting pixel further includes a third transistor which is electrically connected between a gate electrode of the first transistor and a second electrode of the first transistor and of which a gate electrode is electrically connected to a first gate line; and
the sensor pixel further includes a second sensor transistor which is electrically connected between a fourth line and the sensor node and of which a gate electrode is electrically connected to the first gate line.

3. The display device of claim 2, wherein:
the sensor pixel further includes a third sensor transistor which is electrically connected between the first sensor transistor and the readout line and of which a gate electrode is electrically connected to a second gate line;
one frame period includes a first sub-period and a second sub-period that is later than the first sub-period;
a second gate signal having a second turn-on level is applied to the second gate line in the first sub-period; and
a first gate signal having a first turn-on level is applied to the first gate line in the second sub-period.

4. The display device of claim 3, wherein, during a period between the second sub-period of a first frame period and the first sub-period of a second frame period, electric charges are generated by the light-receiving element, and
wherein the sensor pixel outputs a signal corresponding to the electric charges in the first sub-period of the second frame period.

5. The display device of claim 4, wherein, when a touch input occurs in the first frame period, a frequency of the first gate signal after the first frame period is lower than a previous frequency of the first gate signal before the first frame period.

6. The display device of claim 3, wherein:
the light-emitting pixel further includes a fourth transistor which is electrically connected between a data line and a first electrode of the first transistor and of which a gate electrode is connected to a third gate line;
the light-emitting pixel is included in an $i^{th}$ pixel row (wherein i is a natural number); and
the second gate line is electrically connected to the gate electrode of the fourth transistor of a previous light-emitting pixel included in a $(i-1)^{th}$ pixel row.

7. The display device of claim 6, wherein the data line is electrically connected to the readout line.

8. The display device of claim 6, wherein, when a touch input occurs in the first frame period, after the first frame period, a frequency of the first gate signal is lower than a previous frequency of the second gate signal.

9. The display device of claim 3, further comprising a driver configured to receive a detection signal from the sensor pixel through the readout line,
wherein, while the driver receives the detection signal, a frequency of the first gate signal is lower than a frequency of the second gate signal.

10. The display device of claim 1, wherein:
the first transistor includes a silicon semiconductor; and
the second transistor includes an oxide semiconductor.

11. The display device of claim 1, wherein:

a circuit layer including the first transistor, the second transistor, and the first sensor transistor is formed on a substrate; and the light-emitting element and the light-receiving element are disposed on the circuit layer.

12. The display device of claim 1, comprising a first pixel, a second pixel, a third pixel, and a fourth pixel which correspond to the light-emitting pixel and are disposed adjacent to each other in a plan view, wherein:

the first pixel emits light having a first color; the second and fourth pixels emit light having a second color; the third pixel emits light having a third color; and in a plan view, the sensor pixel is positioned between the second pixel and the third pixel or between the second pixel and the first pixel.

13. A method of driving a display device including light-emitting pixels and sensor pixels which share lines, the method comprising:

scanning the light-emitting pixels and the sensor pixels at a first driving frequency to display an emission pattern through at least some of the light-emitting pixels; and scanning the light-emitting pixels and the sensor pixels at a second driving frequency to receive detection signals from the sensor pixels.

\* \* \* \* \*